(12) United States Patent  
Hata et al.

(10) Patent No.: US 8,633,496 B2
(45) Date of Patent: Jan. 21, 2014

(54) OPTICAL DEVICE AND SEMICONDUCTOR WAFER

(75) Inventors: Masahiko Hata, Tsuchiura (JP); Sadanori Yamanaka, Chiba (JP); Tomoyuki Takada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/310,451

(22) Filed: Dec. 2, 2011

(65) Prior Publication Data

US 2012/0068207 A1  Mar. 22, 2012

Related U.S. Application Data

(63) Continuation-in-part of application No. PCT/JP2010/003715, filed on Jun. 3, 2010.

(30) Foreign Application Priority Data

Jun. 5, 2009  (JP) .................... 2009-136664

(51) Int. Cl.  
*H01L 27/15* (2006.01)

(52) U.S. Cl.  
USPC ............. 257/80; 257/E33.048; 257/E31.004

(58) Field of Classification Search  
CPC .... H01L 25/167; H01L 31/173; H01L 31/167  
USPC ............. 257/80, 94, 184, E33.048, E31.004  
See application file for complete search history.

(56) References Cited

U.S. PATENT DOCUMENTS

| 4,614,564 A | 9/1986 | Sheldon et al. |
| 2001/0034069 A1 | 10/2001 | Nakura et al. |
| 2006/0131606 A1 | 6/2006 | Cheng |
| 2007/0023761 A1 | 2/2007 | Robbins |
| 2008/0070355 A1 | 3/2008 | Lochtefeld et al. |
| 2008/0187768 A1 | 8/2008 | Kouvetakis et al. |
| 2010/0308376 A1 | 12/2010 | Takada et al. |
| 2011/0006343 A1 | 1/2011 | Hata et al. |

(Continued)

FOREIGN PATENT DOCUMENTS

| JP | 60-210831 A | 10/1985 |
| JP | 61-094318 A | 5/1986 |

(Continued)

OTHER PUBLICATIONS

Translation of International Preliminary Report on Patentability and Written Opinion issued Jan. 26, 2012, in International Patent Application No. PCT/JP2010/003715.

(Continued)

*Primary Examiner* — Nikolay Yushin  
(74) *Attorney, Agent, or Firm* — Sughrue Mion, PLLC

(57) ABSTRACT

Provided is an optical device including a base wafer containing silicon, a plurality of seed crystals disposed on the base wafer, and a plurality of Group 3-5 compound semiconductors lattice-matching or pseudo lattice-matching the plurality of seed crystals. At least one of the Group 3-5 compound semiconductors has a photoelectric semiconductor formed therein, the photoelectric semiconductor including a light emitting semiconductor that emits light in response to a driving current supplied thereto or a light receiving semiconductor that generates a photocurrent in response to light applied thereto, and at least one of the plurality of Group 3-5 compound semiconductors other than the Group 3-5 compound semiconductor having the photoelectric semiconductor has a heterojunction transistor formed therein.

17 Claims, 23 Drawing Sheets

(56) References Cited

U.S. PATENT DOCUMENTS

| | | |
|---|---|---|
| 2011/0006368 A1 | 1/2011 | Hata et al. |
| 2011/0006399 A1 | 1/2011 | Takada et al. |
| 2011/0012175 A1 | 1/2011 | Takada et al. |
| 2011/0018030 A1 | 1/2011 | Takada et al. |
| 2011/0037099 A1 | 2/2011 | Takada et al. |
| 2011/0180903 A1 | 7/2011 | Hata |
| 2011/0180949 A1 | 7/2011 | Bierdel et al. |
| 2011/0186911 A1 | 8/2011 | Hata |
| 2011/0266595 A1 | 11/2011 | Hata |

FOREIGN PATENT DOCUMENTS

| | | |
|---|---|---|
| JP | 61-135115 A | 6/1986 |
| JP | 61-188927 A | 8/1986 |
| JP | 62-213117 A | 9/1987 |
| JP | 05-327119 A | 12/1993 |
| JP | 08-274376 A | 10/1996 |
| JP | 09-249499 A | 9/1997 |
| JP | 11-176758 A | 7/1999 |
| JP | 2001-308285 A | 11/2001 |
| JP | 2001-339060 A | 12/2001 |
| JP | 2002-299598 A | 10/2002 |
| JP | 2004-179329 A | 6/2004 |
| JP | 2006-080249 A | 3/2006 |
| JP | 2007-036255 A | 2/2007 |
| JP | 2007-073873 A | 3/2007 |
| JP | 2008-532294 A | 8/2008 |

OTHER PUBLICATIONS

First Office Action issued Oct. 21, 2013 in Chinese Patent Application No. 201080023898.4 with English translation.

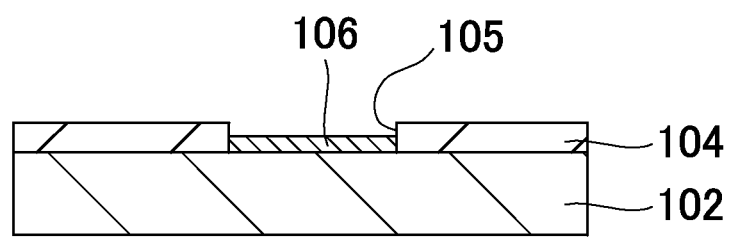
F I G . 3

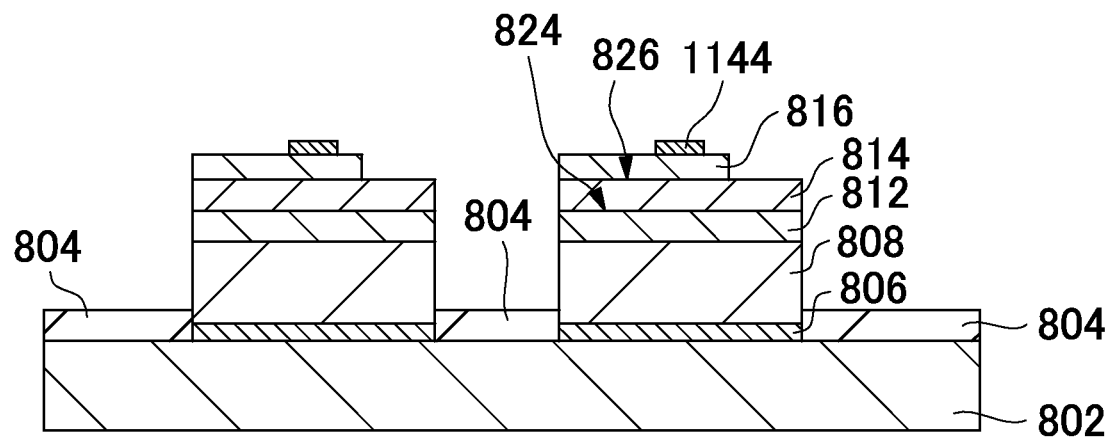
F I G . 12

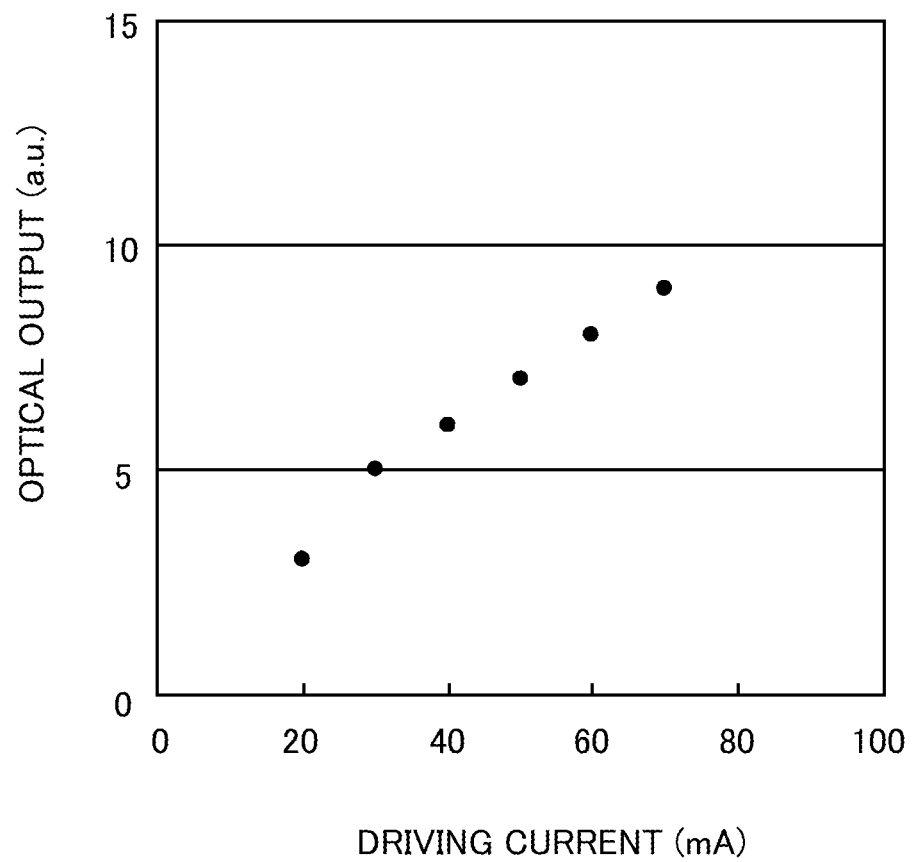
F I G . 21

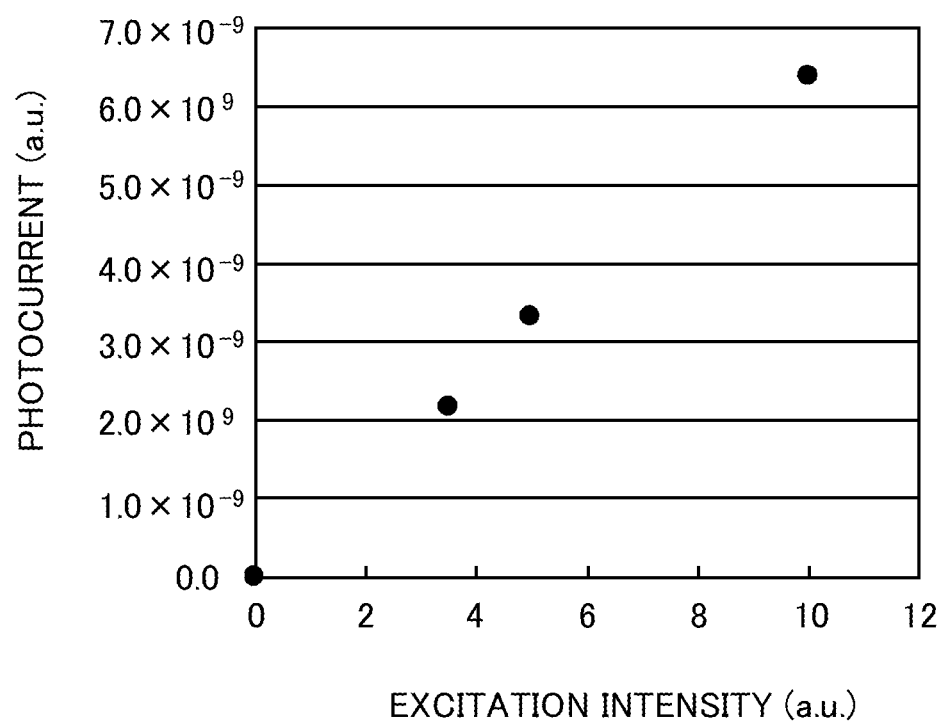
F I G . 22

OPTICAL DEVICE AND SEMICONDUCTOR WAFER

The contents of the following Japanese patent application and PCT patent application are incorporated herein by reference:
 JP2009-136664 filed on Jun. 5, 2009, and
 PCT/JP2010/003715 filed on Jun. 3, 2010.

BACKGROUND

1. Technical Field

The present invention relates to an optical device, a semiconductor wafer, a method of producing an optical device, and a method of producing a semiconductor wafer.

2. Related Art

Japanese Patent Application Publication No. 08-274376 discloses a stack of three LEDs respectively emitting blue, green and red light, specifically speaking, full-color-display pixels including LEDs made of III-V nitride compound semiconductors that lattice-match silicon and are formed on a silicon wafer.

Local optical communication within a single semiconductor wafer has been demanded to realize high-speed communication of a large amount of data within the semiconductor wafer. The transfer rate of optical communication is dependent on the performance of optical devices such as light emitting and receiving devices. Thus, high-speed optical communication can be realized by using fast transistors to control discrete optical devices.

When fast transistors are used to control discrete optical devices, however, it has been difficult to realize improved switching rate of the optical devices and smaller circuits since longer interconnections are required between the transistors and the optical devices. Smaller circuits can be achieved by monolithically forming optical devices and transistors on expensive compound semiconductor wafers made of, for example, GaAs. When monolithically formed on low-cost semiconductor wafers made of, for example, silicon, however, optical devices and transistors cannot achieve performance suitable for high-speed optical communication.

SUMMARY

For a solution to the above-mentioned problems, according to the first aspect related to the present invention, provided is one exemplary optical device including a base wafer containing silicon, a plurality of seed crystals disposed on the base wafer, and a plurality of Group 3-5 compound semiconductors lattice-matching or pseudo lattice-matching the plurality of seed crystals. Here, at least one of the Group 3-5 compound semiconductors has a photoelectric semiconductor formed therein, the photoelectric semiconductor including a light emitting semiconductor that emits light in response to a driving current supplied thereto or a light receiving semiconductor that generates a photocurrent in response to light applied thereto, and at least one of the plurality of Group 3-5 compound semiconductors other than the Group 3-5 compound semiconductor having the photoelectric semiconductor has a heterojunction transistor formed therein.

The heterojunction transistor supplies the driving current to the light emitting semiconductor or amplifies the photocurrent. The optical device further includes an inhibition layer that is formed directly or indirectly on the base wafer, has a plurality of apertures in which at least a partial region of the base wafer is exposed, and inhibits crystal growth. Here, the seed crystals are formed within the apertures.

The plurality of seed crystals are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$), and the light emitting semiconductor and the light receiving semiconductor are Group 3-5 compound semiconductors. The photoelectric semiconductor includes a first-conductivity-type semiconductor containing an impurity that exhibits a first conductivity type that is one of P type and N type, a second-conductivity-type semiconductor containing an impurity that exhibits a conductivity type opposite to that of the first-conductivity-type semiconductor, and a low-carrier-concentration semiconductor that is formed between the first-conductivity-type semiconductor and the second-conductivity-type semiconductor and has a lower carrier concentration than the first-conductivity-type semiconductor and the second-conductivity-type semiconductor.

The optical device further includes a silicon device formed in a region of the base wafer, the region being made of silicon. Here, the photoelectric semiconductor is electrically coupled to the silicon device. When the photoelectric semiconductor includes the light emitting semiconductor, the silicon device supplies the driving current to the light emitting semiconductor, and when the photoelectric semiconductor includes the light receiving semiconductor, the silicon device amplifies the photocurrent. The photoelectric semiconductor is electrically coupled to the silicon device via the heterojunction transistor.

When the photoelectric semiconductor includes the light emitting semiconductor, the silicon device outputs a control signal to control the heterojunction transistor, and when the photoelectric semiconductor includes the light receiving semiconductor, the silicon device amplifies an electric signal output from the heterojunction transistor.

According to the second aspect related to the present invention, provided is one exemplary semiconductor wafer including a base wafer containing silicon, a plurality of seed crystals disposed directly or indirectly on the base wafer, and a plurality of Group 3-5 compound semiconductors lattice-matching or pseudo lattice-matching the plurality of seed crystals. Here, at least one of the Group 3-5 compound semiconductors is a semiconductor that has a photoelectric semiconductor that includes therein a semiconductor that can serve as a light emitting semiconductor that outputs light in response to a driving current to be supplied thereto or a semiconductor that can serve as a light receiving semiconductor that generates a photocurrent in response to light to be applied thereto, and at least one of the plurality of Group 3-5 compound semiconductors other than the Group 3-5 compound semiconductor having the photoelectric semiconductor is a semiconductor in which a heterojunction transistor can be formed.

The heterojunction transistor supplies the driving current to the light emitting semiconductor or amplifies the photocurrent. The semiconductor wafer further includes an inhibition layer that is formed directly or indirectly on the base wafer, has a plurality of apertures in which at least a partial region of the base wafer is exposed, and inhibits crystal growth. Here, the plurality of seed crystals are formed within the plurality of apertures. The plurality of seed crystals are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$).

The base wafer is in contact with the seed crystals, an interface region is included in the base wafer, in contact with the plurality of interfaces between the base wafer and the plurality of seed crystals and is made of $C_{x3}Si_{y3}Ge_{z3}Sn_{1-x3-y3-z3}$ ($0 \leq x3 < 1$, $0 < y3 \leq 1$, $0 \leq z3 \leq 1$ and $0 < x3+y3+z3 \leq 1$), the silicon proportion y1 of the plurality of seed crystals is smaller than the silicon proportion y3 of the interface region. The photoelectric semiconductor includes a first-conductivitytype semiconductor containing an impurity that exhibits a first conductivity type that is one of P type and N type, a second-conductivity-type semiconductor containing an impurity that exhibits a conductivity type opposite to that of the first-conductivity-type semiconductor, and a low-carrier-concentration semiconductor that is formed between the first-conductivity-type semiconductor and the second-conductivity-type semiconductor and has a lower carrier concentration than the first-conductivity-type semiconductor and the second-conductivity-type semiconductor. Each of the plurality of Group 3-5 compound semiconductors is a semiconductor in which a photoelectric semiconductor and a heterojunction transistor can be formed, the photoelectric semiconductor including a light emitting semiconductor that can output light in response to a driving current supplied thereto or a light receiving semiconductor that can generate a photocurrent in response to light applied thereto.

According to the third aspect related to the present invention, provided is one exemplary method of producing an optical device, including forming a plurality of seed crystals on a base wafer containing silicon, forming a plurality of Group 3-5 compound semiconductors lattice-matching or pseudo lattice-matching the plurality of seed crystals by crystal growth, forming, in at least one of the plurality of Group 3-5 compound semiconductors, a photoelectric semiconductor including a light emitting semiconductor that outputs light in response to a driving current supplied thereto or a light receiving semiconductor that generates a photocurrent in response to light applied thereto, forming a heterojunction transistor in at least one of Group 3-5 compound semiconductors other than the Group 3-5 compound semiconductor having the photoelectric semiconductor, and connecting the photoelectric semiconductor and the heterojunction transistor to each other.

The method of producing an optical device, further includes forming a silicon device in a region of the base wafer, the region being made of the silicon, and forming, directly or indirectly on the base wafer, a protective film to cover the silicon device and forming, in the protective film, a plurality of apertures in which at least part of the base wafer is exposed. Here, in the forming the plurality of seed crystals a plurality of seed crystals having a composition $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$) are formed within the apertures by a selective epitaxial growth method. The method further includes, after the forming the photoelectric semiconductor and the forming the heterojunction transistor, removing at least part of the protective film to expose at least part of the silicon device, and coupling at least one selected from among the light emitting semiconductor, the light receiving semiconductor, and the heterojunction transistor to the silicon device.

After the forming the silicon device, the temperature of the silicon device is kept at 600° C. or lower. The plurality of seed crystals are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$). In the forming the plurality of seed crystals the plurality of seed crystals are formed at interval from each other on the base wafer.

The method of producing an optical device, further includes annealing the plurality of seed crystals. Here, the forming the seed crystals and the annealing the seed crystals are performed without exposing the base wafer to air. The annealing the seed crystals and the forming the Group 3-5 compound semiconductors by crystal growth are performed without exposing the base wafer to air.

According to the fourth aspect related to the present invention, provided is one exemplary method of producing a semiconductor wafer, including forming a plurality of seed crystals directly or indirectly on a base wafer containing silicon, annealing the seed crystals, and forming a plurality of Group 3-5 compound semiconductors lattice-matching or pseudo lattice-matching the seed crystals by crystal growth. Here, in the forming the Group 3-5 compound semiconductors by crystal growth, a plurality of first first-conductivity-type semiconductors are respectively formed by crystal growth on the plurality of seed crystals annealed, the first first-conductivity-type semiconductors containing an impurity that exhibits a first conductivity type that is one of P type and N type, a plurality of second-conductivity-type semiconductors are respectively formed by crystal growth on the first first-conductivity-type semiconductors, the second-conductivity-type semiconductors containing an impurity that exhibits a conductivity type opposite to the first conductivity type, and a plurality of second first-conductivity-type semiconductors are respectively formed by crystal growth on the second-conductivity-type semiconductors, the second first-conductivity-type semiconductors containing an impurity that exhibits the first conductivity type.

The method of producing a semiconductor wafer, further includes, prior to the forming the plurality of seed crystals, forming, directly or indirectly on the base wafer, an inhibition layer that has a plurality of apertures in which at least part of the base wafer is exposed and that inhibits crystal growth. Here, in the forming the plurality of seed crystals the plurality of seed crystals are formed by selective epitaxial growth within the apertures, and in forming the plurality of Group 3-5 compound semiconductors by crystal growth the plurality of first first-conductivity-type semiconductors, the plurality of second-conductivity-type semiconductors, and the plurality of second first-conductivity-type semiconductors are formed by selective epitaxial growth.

BRIEF DESCRIPTION OF THE DRAWINGS

FIG. 3 illustrates an exemplary cross-section observed during the production process of the semiconductor wafer 100.

FIG. 12 illustrates an exemplary cross-section observed during the production process of the optical device 1100.

FIG. 21 illustrates the results of observing the light emitted when a driving current is applied to an element P01.

FIG. 22 illustrates the results of observing the photocurrent generated when laser light enters the element P01.

DESCRIPTION OF EXEMPLARY EMBODIMENTS

Figure 1:
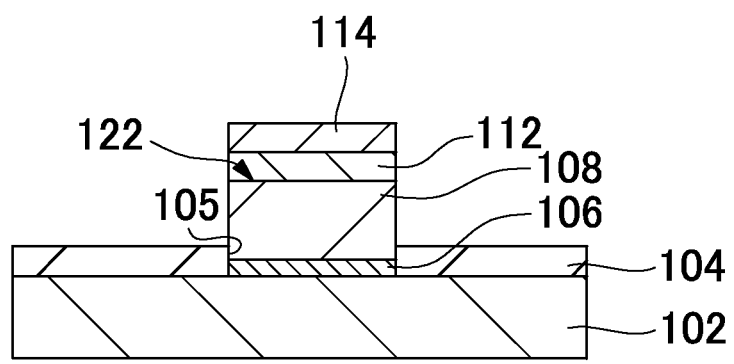
FIG. 1 illustrates an exemplary cross-section of a semiconductor wafer 100.

FIG. 1 illustrates an exemplary cross-section of a semiconductor wafer 100. The semiconductor wafer 100 includes a base wafer 102, an inhibition layer 104, a seed crystal 106, a buffer layer 108, a semiconductor 112, and a semiconductor 114.

The base wafer 102 is a wafer containing silicon. The wafer containing silicon is exemplified by a wafer the surface of which is made of silicon. The base wafer 102 is, for example, a Si wafer, a silicon-on-insulator (SOI) wafer. The base wafer 102 may be a single wafer. In the semiconductor wafer 100, a plurality of seed crystals 106 may be provided on the base wafer 102, and the set of the buffer layer 108, the semiconductor 112, and the semiconductor 114 may be provided for each seed crystal 106.

The inhibition layer 104 is formed on the base wafer 102. The inhibition layer 104 has a plurality of apertures 105 in which at least a partial region of the base wafer 102 is exposed. The inhibition layer 104 inhibits crystal growth. For example, when a semiconductor crystal is grown by an epitaxial growth method, the epitaxial growth of the semiconductor crystal is inhibited on the surface of the inhibition layer 104. Thus, the semiconductor crystal is selectively epitaxially grown within each of the apertures 105.

The inhibition layer 104 is, for example, a silicon oxide layer, a silicon nitride layer, a silicon oxynitride layer, or a stack formed by these layers. The inhibition layer 104 has a thickness of not less than 0.05 μm and not more than 5 μm, for example. The inhibition layer 104 is formed by, for example, thermal oxidization or CVD.

The seed crystal 106 is formed on the base wafer 102. The seed crystal 106 may be $C_{x1}Si_{y1}Ge_{z1}Sn_{1-x1-y1-z1}$ (0≤x1<1, 0≤y1≤1, 0≤z1≤1, and 0<x1+y1+z1≤1). The seed crystal 106 is, for example, a Ge crystal, a SiGe crystal, or a GeSn crystal. The seed crystal 106 provides a seed plane suitable for growing thereon the buffer layer 108, the semiconductor 112 and the semiconductor 114. The seed crystal 106 prevents the impurities present on the surface of the base wafer 102 from adversely affecting the crystallinity of the buffer layer 108, the semiconductor 112 and the semiconductor 114. The seed crystal 106 may include a plurality of layers. The seed crystal 106 may serve as the buffer layer 108, or as the buffer layer 108 and the semiconductor 112 when they are not provided.

The seed crystal 106 is formed in contact with the base wafer 102. In contact with the interface between the base wafer 102 and the seed crystal 106, the base wafer 102 may have therein an interface region that has a composition of $C_{x3}Si_{y3}Ge_{z3}Sn_{1-x3-y3-z3}$ (0≤x3<1, 0<y3≤1, 0≤z3≤1 and 0<x3+y3+z3≤1). The silicon proportion y1 of the seed crystal 106 and the silicon proportion y3 of the interface region satisfy the relation of y3>y1.

The seed crystal 106 is, for example, formed by an epitaxial growth method. The seed crystal 106 is formed, for example, by chemical vapor deposition (CVD), metal organic chemical vapor deposition (MOCVD), molecular beam epitaxy (MBE) or atomic layer deposition ALD). For example, the inhibition layer 104 is formed by thermal oxidation on the base wafer 102, and the aperture 105 is formed in the inhibition layer 104 by photolithography such as etching so as to penetrate through the inhibition layer 104 and reach the surface of the base wafer 102. After this, the seed crystal 106 is epitaxially grown by CVD selectively within the aperture 105.

The seed crystal 106 is preferably subjected to annealing. In the seed crystal 106, lattice defects such as dislocations may be generated due to some factors such as the difference in lattice constant between the base wafer 102 and the seed crystal 106. The defects move within the seed crystal 106, for example, when the seed crystal 106 is heated to be annealed. The defects moving within the seed crystal 106 are trapped by the boundary surface of the seed crystal 106 or gettering sink within the seed crystal 106. In other words, annealing the seed crystal 106 reduces the defects in the seed crystal 106, thereby improving the crystallinity of the seed crystal 106. The seed crystal 106 may be formed by annealing amorphous or poly-crystalline $C_{x1}Si_{y1}Ge_{z1}Sn_{1-x1-y1-z1}$ (0≤x1<1, 0≤y1≤1, 0≤z1≤1, and 0<x1+y1+z1≤1).

The buffer layer 108 is, for example, a semiconductor. The buffer layer 108 is formed on the seed crystal 106. The buffer layer 108 is constituted by one or more semiconductor layers. For example, the buffer layer 108 is constituted by a plurality of semiconductor layers having different compositions. The buffer layer 108 may be a Group 4 semiconductor or a Group 3-5 compound semiconductor. When made of a Group 4 semiconductor, the buffer layer 108 can also serve as the seed crystal 106.

The buffer layer 108 is, for example, a semiconductor layer that lattice-matches or pseudo lattice-matches the seed crystal 106. The buffer layer 108 may be a semiconductor layer that serves as a buffer layer to achieve a match in terms of lattice constant between the semiconductor layer to be formed on the buffer layer 108 and the base wafer 102. The buffer layer 108 further reduces lattice defects resulting from the defects left in the seed crystal 106 and thus provides a crystal plane that can achieve a superior lattice match for the semiconductor layer to be formed on the buffer layer 108. The buffer layer 108 can prevent the impurities left on the surface of the base wafer 102 from degrading the characteristics of the semiconductor element to be formed on the base wafer 102.

As used herein, the term "pseudo lattice-match" indicates the state in which two semiconductors can be stacked together in contact with each other without a perfect lattice match but only a small difference exists between the lattice constants of the two semiconductors in contact with each other and the lattice mismatch produces no significant defects. The difference between the lattice constants is absorbed by elastic deformation of the crystal lattices of the respective semiconductors. For example, a pseudo lattice match may be established between Ge and GaAs, or between Ge and InGaP when the two different semiconductors are stacked together while keeping the thickness without lattice relaxation.

The buffer layer 108 is formed by an epitaxial growth method. For example, the epitaxial growth method includes CVD, MOCVD, MBE and ALD.

The semiconductor 112 contains impurities of a first conductivity type, which is P-type or N-type. The semiconductor 112 is formed on the buffer layer 108. The semiconductor 112 lattice-matches or pseudo lattice-matches the buffer layer 108. In other words, the semiconductor 112 is a semiconductor layer that lattice-matches or pseudo lattice-matches the seed crystal 106 via the buffer layer 108.

The semiconductor 112 may be a Group 4 semiconductor or a Group 3-5 compound semiconductor. The Group 4 semiconductor 112 is, for example, Ge, SiGe, or GeSn. The Group 4 semiconductor 112 can serve as the seed crystal 106 and the buffer layer 108 when they are not provided. The semiconductor 112 may be a stack constituted by a plurality of semiconductor layers differing from each other in terms of composition, doping concentration and thickness.

The semiconductor 114 contains impurities of a second conductivity type, which is opposite to the first conductivity type. For example, when the semiconductor 112 contains P-type impurities, the semiconductor 114 contains N-type impurities. When the semiconductor 112 contains N-type impurities, the semiconductor 114 contains P-type impurities. For example, the semiconductor 114 is formed in contact with the semiconductor 112.

The semiconductor 114 lattice-matches or pseudo lattice-matches the semiconductor 112. Since the semiconductor 112 lattice-matches or pseudo lattice-matches the buffer layer 108, the semiconductor 114 lattice-matches or pseudo lattice-matches the seed crystal 106 via the buffer layer 108 and the semiconductor 112. The semiconductor 114 may be a Group 4 semiconductor or a Group 3-5 compound semiconductor. The Group 4 semiconductor 114 is, for example, Ge, SiGe, or GeSn. The semiconductor 114 exhibits a different conductivity type than the semiconductor 112. The semiconductor 114 may be a stack constituted by a plurality of semiconductor layers differing from each other in terms of composition, doping concentration and thickness.

The semiconductor wafer 100 includes a low-carrier-concentration semiconductor including a space charge region, for example, in the vicinity of a semiconductor junction interface 122 between the semiconductor 112 and the semiconductor 114. The low-carrier-concentration semiconductor has a lower carrier concentration than the semiconductor 112 and the semiconductor 114. For example, the space charge region is a depleted layer in which the effective carrier concentration equivalent to the difference between the electron concentration and the hole concentration is $1.0 \times 10^{16}$ cm$^{-3}$ or less, when the semiconductors 112 and 114 has a carrier concentration of $1.0 \times 10^{18}$ cm$^{-3}$ or higher.

Specifically speaking, since the semiconductors 112 and 114 have different conductivity types from each other, PN junction is formed at the semiconductor junction interface 122 between the semiconductor 114 and the semiconductor 112 and a depleted layer is formed in the vicinity of the PN junction. When a forward voltage is applied to the PN junction formed by the semiconductors 112 and 114, electrons and holes respectively move from the N-type semiconductor and the P-type semiconductor to the depleted layer, so that the electrons and holes are recombined to emit light. Accordingly, in the semiconductor wafer 100, the low-carrier-concentration semiconductor including the depleted layer serves as a light emitting section. The semiconductor wafer 100 including the low-carrier-concentration semiconductor can be used to form an optical device including a light emitting element.

On the other hand, when light enters the depleted layer, the electrons combined with the crystal lattices are released to become free electrons. Thus, free electrons or holes are generated. Thus, the low-carrier-concentration semiconductor including the depleted layer serves as a light receiving section. The semiconductor wafer 100 including the low-carrier-concentration semiconductor can be used to form an optical device including a light receiving element.

The semiconductor wafer 100 may include, between the semiconductor 112 and the semiconductor 114, a stack constituted by a plurality of semiconductor layers differing from each other in terms of composition, doping concentration, and thickness. For example, the semiconductor wafer 100 includes an I-type semiconductor layer as the low-carrier-concentration semiconductor, between the P-type semiconductor 112 and the N-type semiconductor 114. The P-type semiconductor 112, the I-type semiconductor layer, and the N-type semiconductor 114 together form a PIN junction.

The semiconductors 112 and 114 are formed by an epitaxial growth method. The epitaxial growth method includes, for example, CVD, MOCVD, MBE, and ALD.

FIGS. 2 to 5 illustrate exemplary cross-sections observed during the production process of the semiconductor wafer 100. The following describes the method of producing the semiconductor wafer 100 with reference to the drawings. The method of producing the semiconductor wafer 100 includes a step of forming an inhibition layer including an aperture in which at least part of the base wafer is exposed, a step of forming a seed crystal on the base wafer, a step of annealing the seed crystal, a step of forming the semiconductor 112 having the first conductivity type, and a step of forming the semiconductor 114 having the second conductivity type opposite to the first conductivity type. The production method may further include a step of forming the low-carrier-concentration semiconductor, between the step of forming the semiconductor 112 and the step of forming the semiconductor 114.

Figure 2:
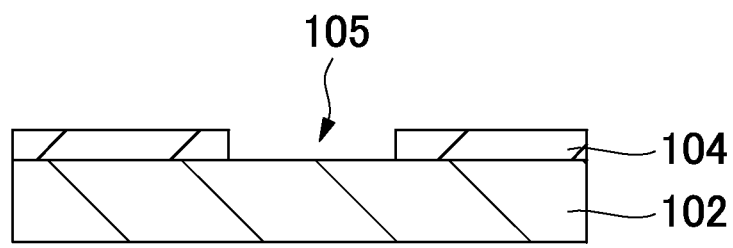
FIG. 2 illustrates an exemplary cross-section observed during the production process of the semiconductor wafer 100.

In the step of forming the inhibition layer, the inhibition layer 104 is formed on the base wafer 102 as shown in FIG. 2. The inhibition layer 104 has therein the aperture 105 that reaches the base wafer 102. Specifically speaking, a silicon oxide film is formed on the entire surface of the base wafer 102 using thermal oxidization. Following this, the aperture 105 is formed in the silicon oxide film so as to reach the surface of the base wafer 102 using photolithography such as etching. In this manner, the inhibition layer 104 is obtained. The inhibition layer 104 may have a plurality of apertures 105.

In the step of forming the seed crystal, the seed crystal 106 is formed within the aperture 105 using a selective epitaxial growth method, as shown in FIG. 3. The seed crystal 106 is $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$). The seed crystal 106 is formed, for example, by epitaxially growing a Ge crystal, a SiGe crystal, or a GeSn crystal using CVD. When the inhibition layer 104 has a plurality of apertures 105, the seed crystal 106 is formed in each of the apertures 105.

Alternatively, in the step of forming the seed crystal, a film that is made of the same material as the seed crystal 106 may be formed on the base wafer 102 and patterned into the seed crystal 106 using photolithography such as etching. In this way, the island-like seed crystal 106 may be formed without forming the inhibition layer 104. In this case, a plurality of island-like seed crystals 106 may be formed at interval from each other.

Figure 4:
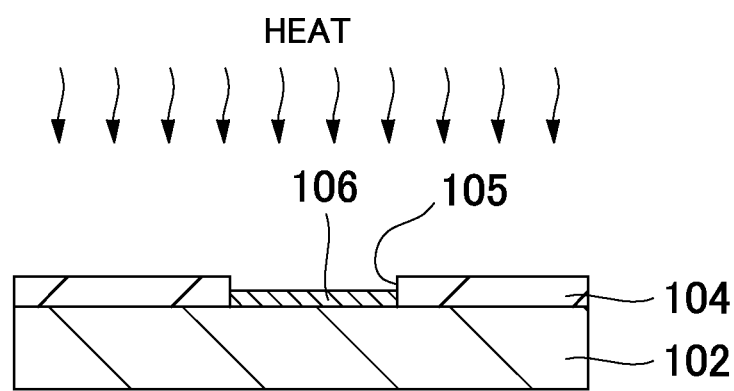
FIG. 4 illustrates an exemplary cross-section observed during the production process of the semiconductor wafer 100.

In the step of annealing the seed crystal, the seed crystal 106 is heated and annealed as shown in FIG. 4. The annealing reduces the lattice defects such as dislocations generated in the seed crystal 106 by some factors such as the difference in lattice constant between the base wafer 102 and the seed crystal 106. As a result, the crystallinity of the seed crystal 106 is improved. The step of forming the seed crystal and the step of annealing the seed crystal are performed without exposing the base wafer 102 to air. For example, these two steps are performed within the same chamber of the same apparatus. Alternatively, these two steps may be performed in different chambers and the base wafer 102 may be transported from the first chamber to the second chamber without exposing the base wafer 102 to air.

In the step of annealing the seed crystal, the seed crystal 106 may be annealed in more than one stage. For example, after high-temperature annealing is first performed at a temperature lower than the melting point of the seed crystal 106, low-temperature annealing is then performed at a temperature lower than the temperature during the high-temperature annealing. This two-stage annealing may be repeatedly performed multiple times. The high-temperature annealing is performed, for example, at the temperature of 850° C. to 900° C. for the duration of 2 minutes to 10 minutes, when the seed crystal 106 contains $Si_xGe_{1-x}$ ($0 \leq x < 1$). The low-temperature annealing is performed, for example, at the temperature of 650° C. to 780° C. for the duration of 2 minutes to 10 minutes. This two-stage annealing is performed ten times, for example.

Figure 5:
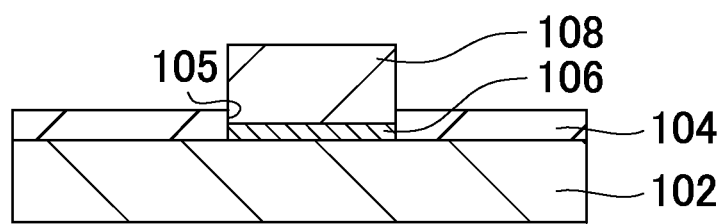
FIG. 5 illustrates an exemplary cross-section observed during the production process of the semiconductor wafer 100.

In the step of forming the semiconductor 112 of the first conductivity type and the step of forming the semiconductor 114 of the second conductivity type, the semiconductor 112 and the semiconductor 114 are sequentially formed. Specifically speaking, the buffer layer 108 is epitaxially grown selectively on the seed crystal 106 as shown in FIG. 5. Subsequently, the semiconductor 112 and the semiconductor 114 are sequentially epitaxially grown selectively on the buffer layer 108 as shown in FIG. 1. When a plurality of seed crystals 106 are formed, the set of the buffer layer 108, the semiconductor 112, and the semiconductor 114 may be formed on each of the seed crystals 106.

The buffer layer 108, the semiconductor 112, and the semiconductor 114 are semiconductor layers that lattice-matches or pseudo lattice-matches the seed crystal 106. The buffer layer 108, the semiconductor 112, and the semiconductor 114 may be a Group 4 semiconductor or a Group 3-5 compound semiconductor. The buffer layer 108 further reduces lattice defects resulting from the defects left in the seed crystal 106 and thus provides a crystal plane that can achieve a superior lattice match for the semiconductors 112 and 114 to be formed on the buffer layer 108. The buffer layer 108 can reduce leakage current. Here, PN junction is formed between the semiconductor 112 and the semiconductor 114, and a space charge region is formed in the vicinity of the semiconductor junction interface 122 between the semiconductor 112 and the semiconductor 114. In the space charge region, the carrier concentration is lower than in the semiconductors 112 and 114.

The buffer layer 108, the semiconductor 112, and the semiconductor 114 are, for example, a Group 3-5 compound semiconductor such as GaAs, AlGaAs, InGaAs, and InGaP. A Group 3-5 compound semiconductor is epitaxially grown using MOCVD. The epitaxial growth is performed in the following manner, for example. After a sufficient proportion of the atmosphere within the MOCVD chamber is replaced with highly pure hydrogen, the base wafer 102, which has the seed crystal 106 thereon, starts to be heated. During the crystal growth, the temperature of the wafer may be kept from 450° C. to 800° C. Once the temperature of the base wafer 102 is settled to an appropriate level, an arsenic source or a phosphor source is introduced into the chamber. Following this, a gallium source, an aluminum source, or an indium source is introduced. In this way, the epitaxial growth is performed.

The Group 3 element source is, for example, trimethylgallium (TMG), trimethyl aluminum (TMA), trimethylindium (TMI). The Group 5 element source gas is, for example, arsine ($AsH_3$), tert-butylarsine (($CH_3$)$_3$$CAsH_2$), phosphine ($PH_3$), tert-buthylphosphine (($CH_3$)$_3$$CPH_2$). During the epitaxial growth, for example, the pressure within the reaction chamber is set to 0.1 atm, the temperature is set at 650° C., and the growth rate is set to 0.1 to 3 µm/hr. The carrier gas for the sources may be highly pure hydrogen.

The epitaxial growth is performed under the following conditions, for example. Under such conditions that the pressure within the reaction chamber is set to 0.1 atm, the temperature is set to 550° C., the growth rate is set to 0.1 to 1 µm/hr, GaAs of approximately 30 nm is deposited. After this, the epitaxial growth is suspended. Subsequently, the temperature is raised to 650° C. while the arsenic source atmosphere is maintained. The epitaxial growth is then resumed under such conditions that the pressure within the reaction chamber is set to 0.1 atm, the temperature is set to 650° C., and the growth rate is set to 0.1 to 3 µm/hr. The carrier gas for the sources may be highly pure hydrogen.

The step of annealing the seed crystal, the step of forming the semiconductor 112, and the step of forming the semiconductor 114 are performed without exposing the base wafer 102 to air. For example, these three steps are performed within the same chamber of the same apparatus. Alternatively, these three steps may be performed in different chambers, and the base wafer 102 may be transported between the chambers without exposing the base wafer 102 to air. By performing the above-described steps, the semiconductor wafer 100 is obtained.

Figure 6:
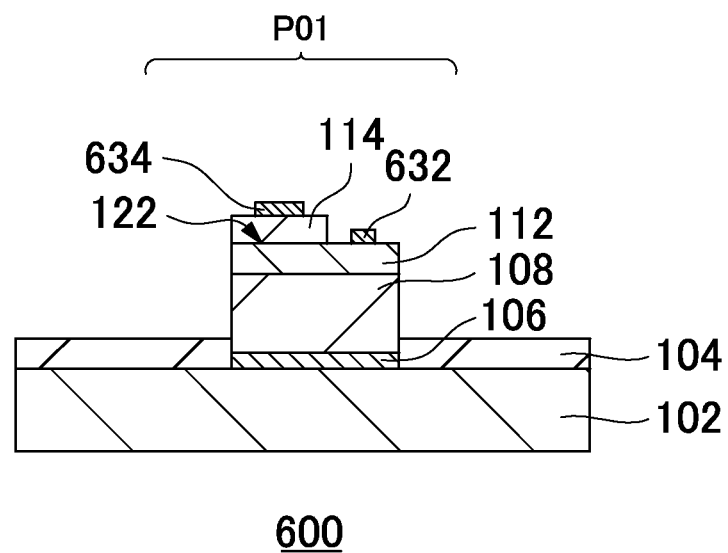
FIG. 6 illustrates an exemplary cross-section of an optical device 600.

FIG. 6 illustrates an exemplary cross-section of an optical device 600. The optical device 600 is an exemplary optical device that can be produced using the semiconductor wafer 100. The optical device 600 includes the base wafer 102, the inhibition layer 104, the seed crystal 106, the buffer layer 108, the semiconductor 112, the semiconductor 114, an electrode 632, and the electrode 634. The optical device 600 shown in FIG. 6 only includes a single element P01, but the optical device 600 may include a plurality of elements P01. The optical device 600 has a low-carrier-concentration semiconductor in the vicinity of the semiconductor junction interface 122 between the semiconductor 112 and the semiconductor 114. The low-carrier-concentration semiconductor has a space charge region such as a depleted layer. The following describes the optical device 600 with reference to the drawings, but the constituents that are common between the optical device 600 and the semiconductor wafer 100 are not descried in the following.

Electrodes 632 and 634 are respectively formed in contact with the semiconductors 112 and 114 to respectively connect the semiconductors 112 and 114 to an external circuit. The electrodes 632 and 634 are made of an electrically conductive material. The electrodes 632 and 634 are, for example, made of a metal. The electrodes 632 and 634 are made of, for example, AuGe/Ni/Au, AuZn, AuNi, or AuCr. The electrodes 632 and 634 may have a multilayered structure constituted by the above-listed electrically conductive materials. The electrodes 632 and 634 are, for example, formed by sputtering or vacuum vapor deposition.

Figure 7:
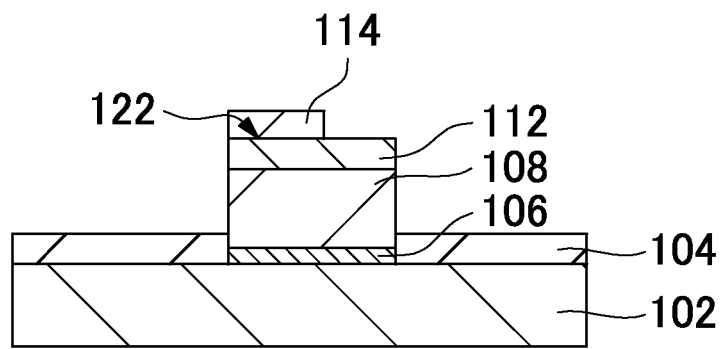
FIG. 7 illustrates an exemplary cross-section observed during the production process of the optical device 600.

FIG. 7 illustrates an exemplary cross-section observed during the production process of the optical device 600. The optical device 600 is produced using the semiconductor wafer 100 in such a manner that a mesa of the semiconductor 114 is first formed as shown in FIG. 7 and the electrodes 634 and 632 are then formed as shown in FIG. 6. The mesa of the semiconductor 114 is formed by photolithography such as etching.

The electrode 634 is formed in the following manner. To begin with, a resist mask is formed using photolithography that has an aperture at a position at which the electrode 634 is to be formed. Subsequently, a metal is deposited on the resist mask. Lastly, the resist is lifted off. In this manner, the electrode 634 is obtained. The electrode 632 is formed in the same manner. The electrodes 634 and 632 may be simultaneously formed. Alternatively, the electrode 632 may be formed after the electrode 634 is formed on the semiconductor 114 using the lift-off method and the mesa of the semiconductor 114 is then formed using photolithography such as etching.

For example, when the semiconductor 114 is a P-type semiconductor and the semiconductor 112 is an N-type semiconductor, PN junction is formed between the semiconductor 112 and the semiconductor 114 and a low-carrier-concentration semiconductor including a space charge region is formed in the vicinity of the PN junction. When a forward voltage is applied between the electrode 634 and the electrode 632, electrons and holes move to the space charge region respectively from the semiconductor 112 and the semiconductor 114, so that the electrons and the holes are recombined to emit light. In this case, the low-carrier-concentration semiconductor serves as a light emitting section adapted to emit light, and the optical device 600 serves as a light emitting element. On the other hand, when light enters the vicinity of the space charge region, the electrons combined with the crystal lattices are released to become free electrons, so that the free electrons or holes are generated. In this case, the low-carrier-concentration semiconductor serves as a light receiving section adapted to generate photocurrent, and the optical device 600 serves as a light receiving element.

The semiconductors 114 and 112 may each be a stack constituted by a plurality of semiconductor layers differing from each other in terms of composition, doping concentration, and thickness. The optical device 600 may also have, between the semiconductor 114 and the semiconductor 112, a stack that has a limited thickness and is constituted by a plurality of semiconductor layers differing from each other in terms of composition, doping concentration and thickness.

The above describes, as an example, the optical device 600 having PN junction. The above-mentioned light emitting section may be a PN-junction light emitting diode (LED), a laser diode (LD), a vertical cavity surface emitting laser (VCSEL). The above-mentioned light receiving section may be a PN diode, a PIN diode, a metal-semiconductor-metal (MSM) diode, an avalanche photodiode, a photosensor such as a CCD or a MOS, or a solar cell.

Figure 8:
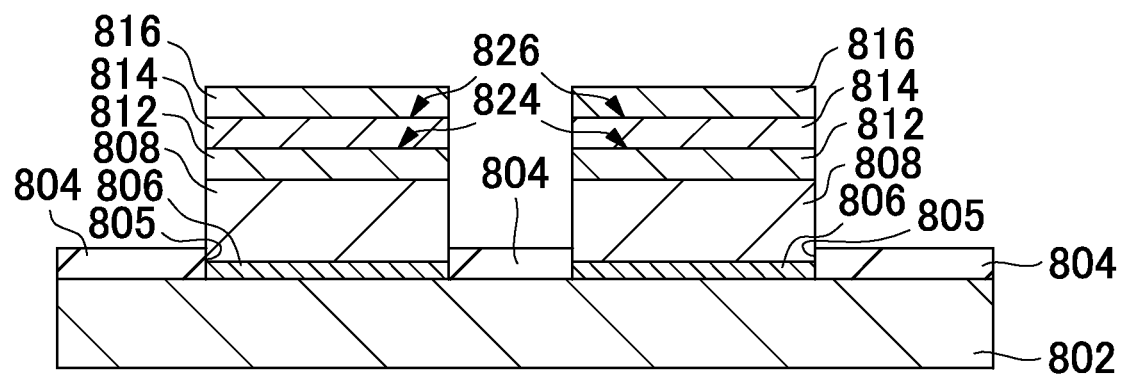
FIG. 8 illustrates an exemplary cross-section of a semiconductor wafer 800.

FIG. 8 illustrates an exemplary cross-section of a semiconductor wafer 800 relating to a different embodiment. The semiconductor wafer 800 includes a base wafer 802, an inhibition layer 804, a seed crystal 806, a buffer layer 808, a semiconductor 812, a semiconductor 814, and a semiconductor 816. From among the constituents of the semiconductor wafer 800, the base wafer 802 is equivalent to and has a similar configuration to the base wafer 102 of the semiconductor wafer 100. The inhibition layer 804 is equivalent to and has a similar configuration to the inhibition layer 104. The seed crystal 806 is equivalent to and has a similar configuration to the seed crystal 106. The buffer layer 808 may be equivalent to and have a similar configuration to the buffer layer 108. Accordingly, the constituents that are common between the semiconductor wafer 800 and the semiconductor wafer 100 are not described in the following.

In the semiconductor wafer 800, a plurality of seed crystals 806 may be provided on a single base wafer 802. The set of the buffer layer 808, the semiconductor 812, the semiconductor 814, and the semiconductor 816 is provided for each seed crystal 806. The buffer layer 808, the semiconductor 812, the semiconductor 814, and the semiconductor 816 are formed by an epitaxial growth method. The epitaxial growth method includes, for example, CVD, MOCVD, MBE, and ALD.

The semiconductors 812, 814, and 816 are sequentially formed on the buffer layer 808. The semiconductors 812, 814, and 816 lattice-match or pseudo lattice-match the seed crystal 806 via the buffer layer 808. The semiconductors 812, 814, and 816 may be a Group 4 semiconductor or a Group 3-5 compound semiconductor. The Group 3-5 compound semiconductor may be designed to be used to form a heterojunction transistor. The Group 3-5 compound semiconductor is, for example, GaP, GaAs, GaAsP, AlGaAs, InGaP, InGaAs, InGaAsP, AlInGaP, GaN, or InGaN. The above-mentioned heterojunction transistor may be a heterojunction bipolar transistor (HBT), a high electron mobility transistor (HEMT), a pseudomorphic-high electron mobility transistor (p-HEMT), or a metal-insulator-semiconductor field-effect transistor (MISFET).

The semiconductors 812, 814, and 816 may together form a heterojunction transistor having NPN junction. Alternatively, the semiconductors 812, 814, and 816 may together form a heterojunction transistor having PNP junction. The semiconductors 812, 814, and 816 may have low-carrier-concentration semiconductors in the vicinity of a semiconductor junction interface 824 and a semiconductor junction interface 826.

The semiconductors 812, 814, and 816 may each be a stack constituted by a plurality of semiconductor layers differing from each other in terms of composition, doping concentration, and thickness. For example, at the semiconductor junction interface 824 or 826, between the semiconductor 812 and the semiconductor 814, or between the semiconductor 814 and the semiconductor 816, a stack is provided that has a limited thickness and is constituted by a plurality of semiconductor layers differing from each other in terms of composition, doping concentration and thickness.

Figure 9:
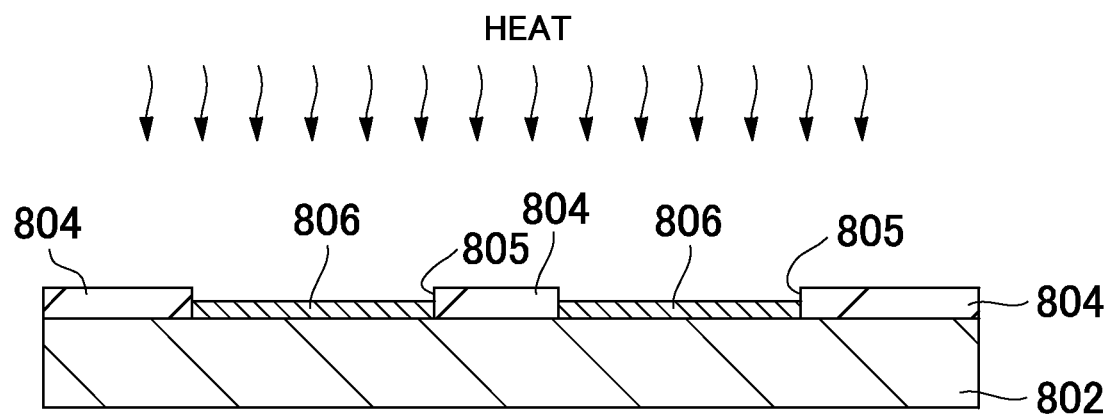
FIG. 9 illustrates an exemplary cross-section observed during the production process of the semiconductor wafer 800.
Figure 10:
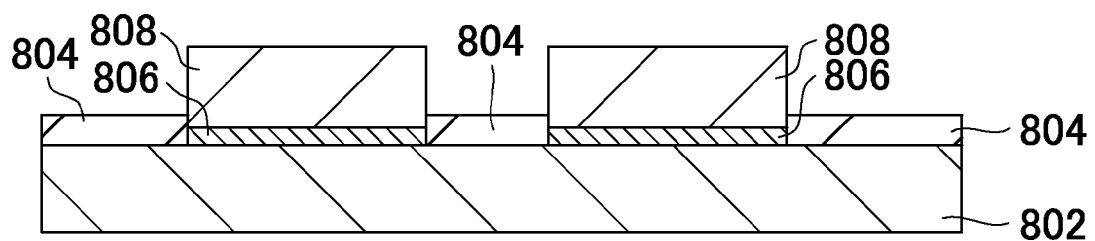
FIG. 10 illustrates an exemplary cross-section observed during the production process of the semiconductor wafer 800.

FIGS. 9 and 10 illustrate exemplary cross-sections observed during the production process of the semiconductor wafer 800. The following describes the method of producing the semiconductor wafer 800 with reference to the drawings. Similarly to the method of producing the semiconductor wafer 100, the method of producing the semiconductor wafer 800 includes a step of forming on the base wafer 802 the inhibition layer 804 having apertures, a step of forming the seed crystals 806 on the base wafer 802, a step of annealing the seed crystals 806, a step of forming the semiconductors 812 of the first conductivity type, a step of forming the semiconductors 814 of the second conductivity type opposite to the first conductivity type, and a step of forming the semiconductors 816 of the first conductivity type.

The production method may further include a step of forming a low-carrier-concentration semiconductor between the step of forming the semiconductors 812 and the step of forming the semiconductors 814, and between the step of forming the semiconductors 814 and the step of forming the semiconductors 816. In the following, the steps that are common between the methods of producing the semiconductor wafers 100 and 800 are not described.

In the step of forming the inhibition layer 804, the inhibition layer 804 is formed on the base wafer 802 as shown in FIG. 9. The inhibition layer 804 has therein the apertures 805 that reach the base wafer 802. For example, a silicon oxide film is formed on the entire surface of the base wafer 802 using thermal oxidization. The apertures 105 are formed by photolithography such as etching in the silicon oxide film so as to reach the surface of the base wafer 802.

In the step of forming the seed crystals 806, the seed crystals 806 are formed respectively in the apertures 105 using a selective epitaxial growth method. The seed crystals 806 are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$). Alternatively, a film that is made of the same material as the seed crystals 806 may be formed on the base wafer 802 and patterned into the seed crystals 806 using photolithography such as etching. In this way, the island-like seed crystals 806 may be formed at interval from each other without forming the inhibition layer 804.

In the step of annealing the seed crystals 806, the seed crystals 806 are heated and annealed as shown in FIG. 9. The step of forming the seed crystals and the step of annealing the seed crystals may be performed without exposing the base wafer 802 to air. The seed crystals 806 may be annealed in more than one stage.

In the step of forming the semiconductors 812, the step of forming the semiconductors 814, and the step of forming the semiconductors 816, the buffer layers 808 are epitaxially grown selectively on the seed crystals 806 as shown in FIG. 10. After this, the semiconductors 812, the semiconductors 814, and the semiconductors 816 are sequentially epitaxially grown selectively on the buffer layers 808 as shown in FIG. 8.

For example, the buffer layers 808, the semiconductors 812, the semiconductors 814, and the semiconductors 816 are a Group 3-5 compound semiconductor such as GaAs, AlGaAs, InGaAs, and InGaP. In this case, the Group 3-5 compound semiconductor is epitaxially grown using MOCVD. The epitaxial growth is performed in the following manner, for example. After a sufficient proportion of the atmosphere within the MOCVD chamber is substituted by highly pure hydrogen, the base wafer 802 having the seed crystals 806 formed thereon starts to be heated. During the crystal growth, the temperature of the wafer may be kept from 450° C. to 800° C. Once the temperature of the base wafer 802 is settled to an appropriate level, an arsenic source or a phosphor source is introduced into the chamber. Following this, a gallium source, an aluminum source, or an indium source is introduced. In this way, the Group 3-5 compound semiconductor is epitaxially grown.

The Group 3 element source is, for example, trimethylgallium (TMG), trimethyl aluminum (TMA), trimethylindium (TMI). The Group 5 element source gas is, for example, arsine ($AsH_3$), tert-butylarsine (($CH_3$)$_3CAsH_2$), phosphine ($PH_3$), tert-buthylphosphine (($CH_3$)$_3CPH_2$). As the donor impurity element, Si, S, Se or Te may be added. As the acceptor impurity element, C, Mg, or Zn may be added.

The epitaxial growth is performed, for example, under such conditions that the pressure within the reaction chamber is set to 0.1 atm, the temperature is set to 650° C., and the growth rate is set to 1 to 3 μm/hr. As another example, the epitaxial growth is performed under such conditions that the pressure within the reaction chamber is set to 0.1 atm, the temperature is set to 550° C., the growth rate is set to 0.1 to 1 μm/hr until GaAs of approximately 30 nm is deposited. After this, the epitaxial growth is suspended. Subsequently, the temperature is raised to 650° C. while the arsenic source atmosphere is maintained. The epitaxial growth may be then resumed under such conditions that the pressure within the reaction chamber is set to 0.1 atm, the temperature is set to 650° C., and the growth rate is set to 0.1 to 3 μm/hr. The carrier gas for the sources is highly pure hydrogen, for example. The step of annealing the seed crystals 806, the step of forming the semiconductors 812, the step of forming the semiconductors 814, and the step of forming the semiconductors 816 may be performed without exposing the base wafer 802 to air.

Figure 11:
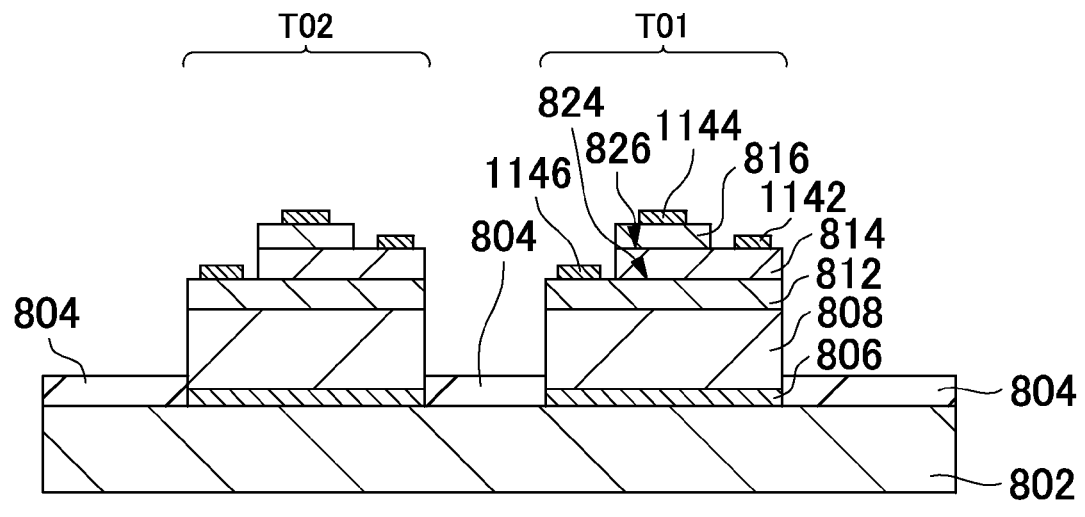
FIG. 11 illustrates an exemplary cross-section of an optical device 1100.

FIG. 11 illustrates an exemplary cross-section of an optical device 1100 relating to a different embodiment. The optical device 1100 can be, as an example, produced using the semiconductor wafer 800. The optical device 1100 includes a transistor T01 and a transistor T02. The transistors T01 and T02 may be heterojunction transistors. Although the present embodiment is described assuming that the transistors T01 and T02 are heterojunction bipolar transistors, the transistors T01 and T02 may be high electron mobility transistors (HEMTs), pseudomorphic-high electron mobility transistors (p-HEMTs), or metal-insulator-semiconductor field-effect transistors (MISFETs). The following description is made assuming that the transistors T01 and T02 are NPN transistors, but the transistors T01 and T02 may be alternatively PNP transistors.

The transistor T01 includes the base wafer 802, the inhibition layer 804, the seed crystal 806, the buffer layer 808, the N-type semiconductor 812, the P-type semiconductor 814, the N-type semiconductor 816, a base electrode 1142, an emitter electrode 1144 and a collector electrode 1146. The transistor T01 has low-carrier-concentration semiconductors in the vicinity of the semiconductor junction interface 824 and the semiconductor junction interface 826. For example, the low-carrier-concentration semiconductors have therein a space charge region such as a depleted layer.

The transistor T01 may have an I-type semiconductor layer between the N-type semiconductor 812 and the P-type semiconductor 814 and have an I-type semiconductor layer between the P-type semiconductor 814 and the N-type semiconductor 816. The N-type semiconductor 816 may be a stack constituted by a plurality of semiconductor layers differing from each other in terms of concentration of donor impurity element. The transistor T02 may have a similar configuration to the transistor T01. Thus, the transistor T02 is not described in the following except for the case where the transistors T01 and T02 need to be distinguished from each other.

The N-type semiconductor 812 may constitute the collector of the transistor T01. The P-type semiconductor 814 may constitute the base of the transistor T01. The N-type semiconductor 816 may constitute the emitter of the transistor T01.

The base electrode 1142 is formed in contact with the P-type semiconductor 814, which serves as the base, to connect the P-type semiconductor 814 to an external circuit. The base electrode 1142 is made of a conductive material. The base electrode 1142 is made of a metal. The base electrode 1142 is, for example, made of AuZn, CrAu, Ti/Pt, or Ti/Pt/Au. The base electrode 1142 is, for example, formed by sputtering or vacuum vapor deposition.

The emitter electrode 1144 is formed in contact with the N-type semiconductor 816, which serves as the emitter, to connect the N-type semiconductor 816 to an external circuit. The emitter electrode 1144 is made of an electrically conductive material. The emitter electrode 1144 is, for example, made of a metal. The emitter electrode 1144 is, for example, made of AuGe/Ni/Au. The emitter electrode 1144 is, for example, formed by sputtering or vacuum vapor deposition.

The collector electrode 1146 is formed in contact with the N-type semiconductor 812, which serves as the collector, to connect the N-type semiconductor 812 to an external circuit. The collector electrode 1146 is made of an electrically conductive material. The collector electrode 1146 is, for example, made of a metal. The collector electrode 1146 is, for example, made of AuGe/Ni/Au. The collector electrode 1146 is, for example, formed by sputtering or vacuum vapor deposition.

The transistors T01 and T02 can be used as normal HBTs. In other words, their switching or amplifying capability can be used in electric circuits. The transistors T01 and T02 can also serve as a photoelectric semiconductor including a light emitting element or a light receiving element. Here, the light emitting element includes a light emitting semiconductor configured to emit light in response to a driving current supplied thereto, and the light receiving element includes a light receiving semiconductor configured to generate a photocurrent in response to light applied thereto.

Specifically speaking, PN junction is formed at the semiconductor junction interface 826 between the N-type semiconductor 816 serving as the emitter and the P-type semiconductor 814 serving as the base. In the vicinity of the semiconductor junction interface 826, a low-carrier-concentration semiconductor that has therein a space charge region is formed. The space charge region is, for example, a depleted layer. When a forward voltage is applied to the PN junction formed between the N-type semiconductor 816 and the P-type semiconductor 814, electrons and holes respectively move from the N-type semiconductor 816 and the P-type semiconductor 814 to the low-carrier-concentration semiconductor, so that the electrons and holes are recombined to emit light. In other words, the N-type semiconductor 816, the P-type semiconductor 814, and the low-carrier-concentration semiconductor together serve as the light emitting semiconductor configured to emit light in response to a driving current supplied thereto.

Likewise, PN junction is formed at the semiconductor junction interface 824 between the P-type semiconductor 814 serving as the base and the N-type semiconductor 812 serving as the collector. In the vicinity of the semiconductor junction interface 824, a low-carrier-concentration semiconductor that has therein a space charge region is formed. The space charge region is, for example, a depleted layer. When light enters the low-carrier-concentration semiconductor, the electrons combined with the crystal lattices are released to become free electrons, so that free electrons or holes are generated. In other words, the P-type semiconductor 814, the N-type semiconductor 812, and the low-carrier-concentration semiconductor together serve as the light receiving semiconductor configured to generate a photocurrent in response to light applied thereto. A non-doped semiconductor layer may be provided between the P-type semiconductor 814 serving as the base and the N-type semiconductor 812 serving as the collector. In this case, PIN junction is formed between the P-type semiconductor 814 and the N-type semiconductor 812 to enable the P-type semiconductor 814, the non-doped semiconductor layer and the N-type semiconductor 812 to serve as a faster light receiving element.

As described above, when the transistors T01 and T02 serve as a light emitting element, the low-carrier-concentration semiconductor in the vicinity of the semiconductor junction interface between the emitter and the base of one of the transistors T01 and T02 serves as the light emitting section and the other one of the transistors T01 and T02 is configured to supply this low-carrier-concentration semiconductor with a driving current. On the other hand, when the transistors T01 and T02 serve as a light receiving element, the low-carrier-concentration semiconductor in the vicinity of the semiconductor junction interface between the base and the collector of one of the transistors T01 and T02 serves as a light receiving section and the other one of the transistors T01 and T02 is configured to amplify the photocurrent generated by this low-carrier-concentration semiconductor.

The optical device 1100 only includes two transistors T01 and T02 in FIG. 11, but may include more transistors. Since some of the transistors of the optical device 1100 are configured to serve as the light emitting and receiving elements, the single type of process of forming the transistor T01 can monolithically form, on the same base wafer 802, the light emitting element, the light receiving element, the driver transistor, the amplifier transistor and the like. As a result, highly-integrated and high-speed optical devices can be achieved.

In the optical device 1100 shown in FIG. 11, the portion serving as an optical device such as a light emitting element and the portion serving as an electronic device such as a transistor are formed using identical epitaxial semiconductor multilayer structures constituted by the semiconductors 812, 814 and 816. The portion serving as an optical device such as a light emitting element and the portion serving as an electronic device such as a transistor may be formed using different epitaxial multilayer structures formed on the same base wafer 802. For example, a transistor may be formed using the semiconductors 812, 814 and 816 of the semiconductor wafer 800, and a plurality of semiconductor layers may be epitaxially grown on the transistor so that a light emitting element may be formed using these semiconductor layers.

Figure 13:
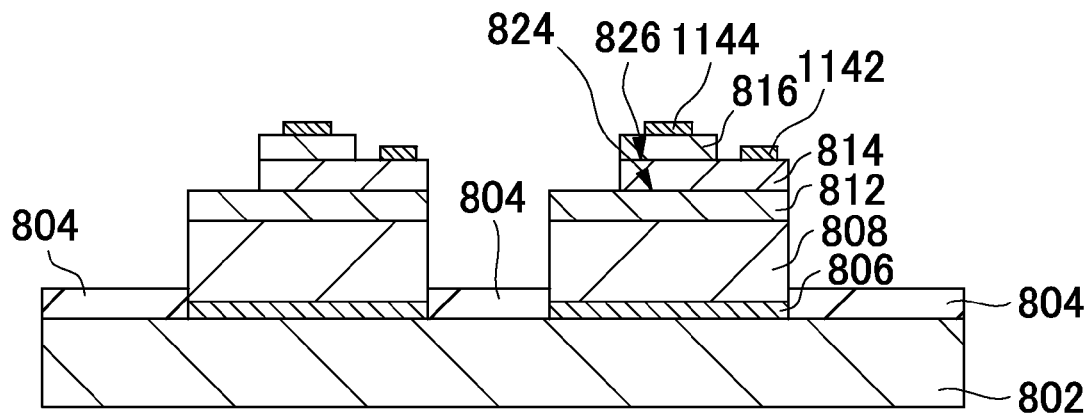
FIG. 13 illustrates an exemplary cross-section observed during the production process of the optical device 1100.

FIGS. 12 and 13 illustrates exemplary cross-sections observed during the production process of the optical device 1100. The following describes the method of producing the optical device 1100 with reference to the drawings.

The semiconductor wafer 800 is used. The emitter electrode 1144 is formed in contact with the semiconductor 816. For example, the emitter electrode 1144 is formed by forming a resist mask, in which an aperture is formed at a position at which the emitter electrode 1144 is to be formed, on the surface of the semiconductor 816 using photolithography, depositing a metal, and then lifting the resist off. As shown in FIG. 12, an emitter mesa is then formed using photolithography such as etching. Subsequently, as shown in FIG. 13, a collector mesa is formed using photolithography such as etching, and the base electrode 1142 is formed. Subsequently, as shown in FIG. 11, the collector electrode 1146 is formed. Here, the order of the mesa formation steps and the electrode formation steps is not limited to the above-described order. For example, the emitter electrode 1144 may be formed after the emitter mesa is formed.

In the above-described example, the emitter-base junction of the HBT is used as a light emitting element, and the base-collector junction of the HBT is used as a light receiving element. Alternatively, however, a metal-semiconductor-metal (MSM) photodetector may be provided by forming a metal electrode on the buffer layer of a pseudomorphic-high electron mobility transistor (p-HEMT).

Figure 14:
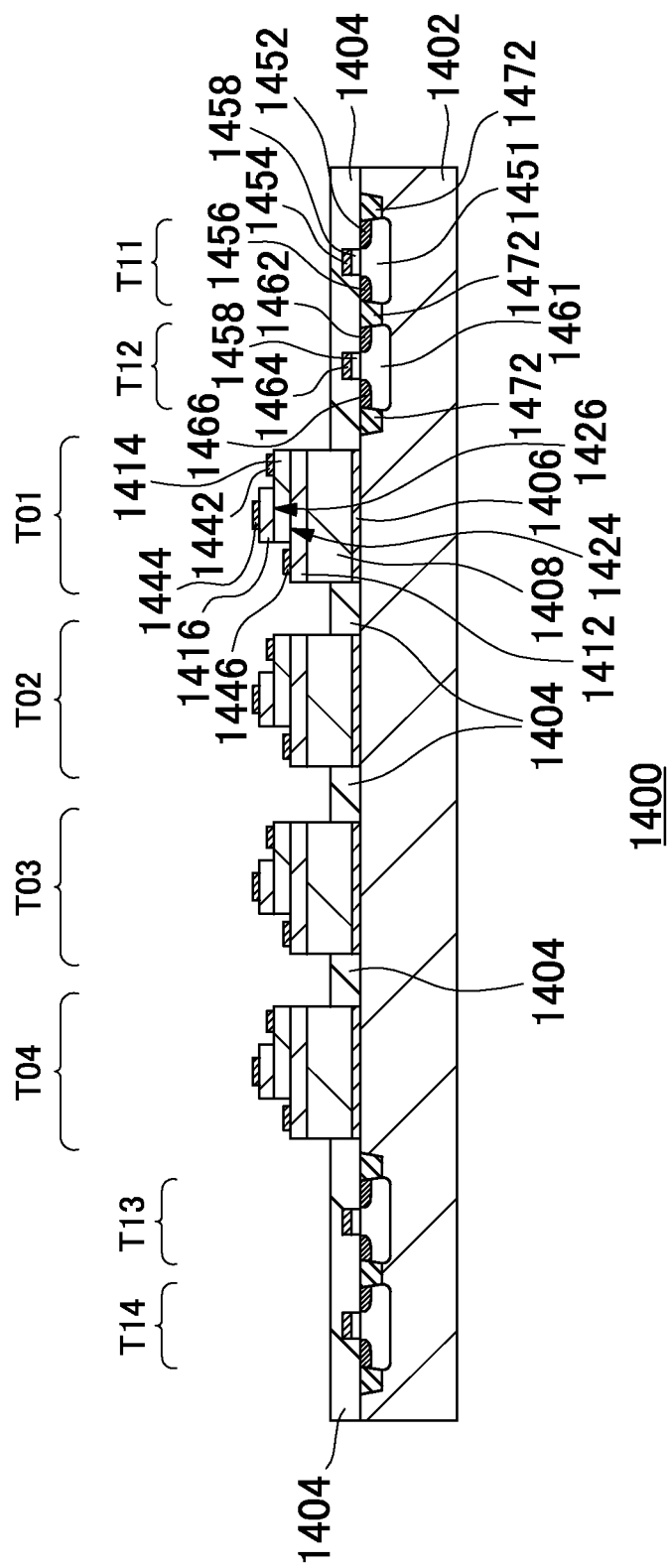
FIG. 14 illustrates an exemplary cross-section of an optical device 1400.

FIG. 14 illustrates an exemplary cross-section of an optical device 1400 relating to another embodiment. The optical device 1400 includes a base wafer 1402, a protective film 1404, device isolation insulative layers 1472, a transistor T01, a transistor T02, a transistor T03, a transistor T04, a transistor T11, a transistor T12, a transistor T13, and a transistor T14. The transistors T01, T02, T03, and T04 may be equivalent to and have the same configuration as the transistor T01 of the optical device 1100.

The transistors T11, T12, T13 and T14 may each be a silicon device the active region of which is formed in the silicon contained in the base wafer 1402. In the present embodiment, the silicon device is exemplified by a field-effect transistor, such as the transistors T11, T12, T13 and T14. Alternatively, the silicon device may be an electronic circuit including a diode (including a Zener diode), a transistor, a logic circuit, a switch circuit, an analog circuit, a capacitor or an inductor, or an optical circuit including an optical waveguide, an optical switch or an optical divider/multiplexer.

The base wafer 1402 may be equivalent to and have a similar configuration to the base wafer 802 of the optical device 1100. The protective film 1404 is an insulative film to protect the silicon devices T11, T12, T13 and T14. The protective film 1404 serves as an inhibition layer during the process of forming the transistors T01, T02, T03 and T04 and thus has a similar configuration to the inhibition layer 804 of the optical device 1100.

The transistor T01 includes the base wafer 1402, the protective film 1404, a seed crystal 1406, a buffer layer 1408, an N-type semiconductor 1412, a P-type semiconductor 1414, an N-type semiconductor 1416, a base electrode 1442, an emitter electrode 1444, and a collector electrode 1446. The seed crystal 1406 is equivalent to and has a similar configuration to the seed crystal 806 of the optical device 1100. The buffer layer 1408 is equivalent to and has a similar configuration to the buffer layer 808. The N-type semiconductor 1412, the P-type semiconductor 1414, and the N-type semiconductor 1416 are respectively equivalent to and have similar configurations to the N-type semiconductor 812, the P-type semiconductor 814, and the N-type semiconductor 816. The base electrode 1442, the emitter electrode 1444, and the collector electrode 1446 are respectively equivalent to and have similar configurations to the base electrode 1142, the emitter electrode 1144, and the collector electrode 1146.

In the present embodiment, the transistors T01, T02, T03 and T04 are, for example, heterojunction bipolar transistors, but may be alternatively heterojunction field-effect transistors. Alternatively, some of the transistors T01, T02, T03, and T04 may be heterojunction bipolar transistors and the others may be heterojunction field-effect transistors.

The transistor T11 includes a well 1451, a source 1452, a gate electrode 1454, a drain 1456, and a gate insulator 1458. The present embodiment is described assuming that the transistor T11 is a field-effect transistor including a P-type channel, but the transistor T11 may be a field-effect transistor including an N-type channel.

The transistor T12 includes a well 1461, a drain 1462, a gate electrode 1464, a source 1466 and a gate insulator 1458. The present embodiment is described assuming that the transistor T12 is a field-effect transistor including an N-type channel, but the transistor T12 may be a field-effect transistor including a P-type channel.

The transistor T13 has a similar configuration to the transistor T11 or T12. The transistor T14 has a similar configuration to the transistor T12 or T11.

The transistors T01, T02, T03, and T04 are monolithically formed on the same base wafer 1402 as the transistors T11, T12, T13 and T14, which are silicon devices. The transistors T01, T02, T03 and T04 may be coupled to the transistors T11, T12, T13 and T14, which are silicon devices, to form an electrical circuit.

In the optical device 1400, the low-carrier-concentration semiconductor having therein a space charge region in the vicinity of the semiconductor junction interface between the emitter and the base of any one of the transistors T01, T02, T03 and T04 may serve as a light emitting semiconductor, which is a light emitting section adapted to emit light in response to a driving current supplied thereto. The low-carrier-concentration semiconductor having therein a space charge region in the vicinity of the semiconductor junction interface between the base and the collector of any one of the transistors T01, T02, T03 and T04 may serve as a light receiving semiconductor, which is a light receiving section adapted to generate a photocurrent in response to light applied thereto.

For example, the space charge region in the vicinity of the semiconductor junction interface 1426 of the transistor T02 may serve as a light emitting section, and the transistor T01 may serve as a switch to drive the light emitting section. As another example, the space charge region in the vicinity of the semiconductor junction interface 1424 of the transistor T03 may serve as a light receiving section, and the transistor T04 may serve as an amplifier to amplify the signal supplied from the light receiving section.

Furthermore, the transistors T11, T12, T13 and T14, which are silicon devices, may form an input/output circuit for a space charge region that serves as a light emitting or receiving section. For example, the transistors T11 and T12 form an inverter circuit. The driver circuit including this inverter circuit may be configured to output a control signal to control the transistor T01, which is adapted to supply the light emitting section of the transistor T02 with a driving current. The transistors T13 and T14 may form a circuit that is configured to amplify the electrical signal output from the light receiving section of the transistor T03.

In the present embodiment, as described above, the transistor T02 having therein the light emitting section, the transistor T03 having therein the light receiving section, the driver transistor T01, the amplifier transistor T04, and the transistors T11, T12, T13 and T14, which are silicon devices, are all monolithically formed on the same base wafer 1402. Therefore, improved integration is achieved for the circuits and a smaller size is accomplished for the optical device formed using heterojunction compound semiconductors, with it being possible to maintain the advantages, such as high sensitivity and high speed, of the optical device.

Figure 15:
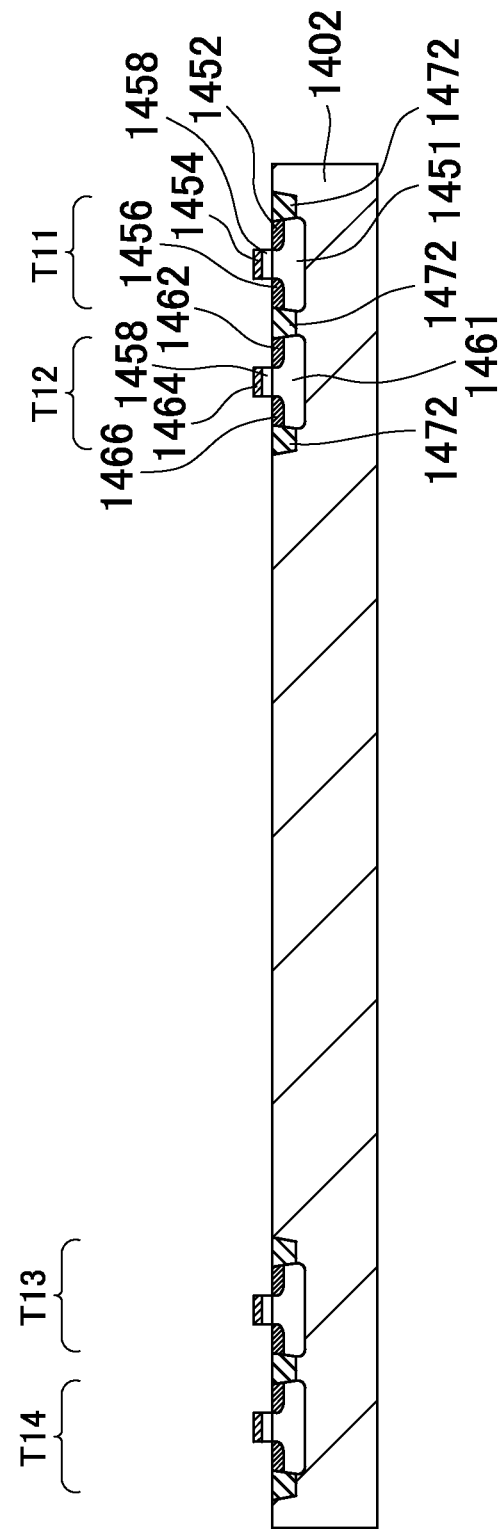
FIG. 15 illustrates an exemplary cross-section observed during the production process of the optical device 1400.
Figure 16:
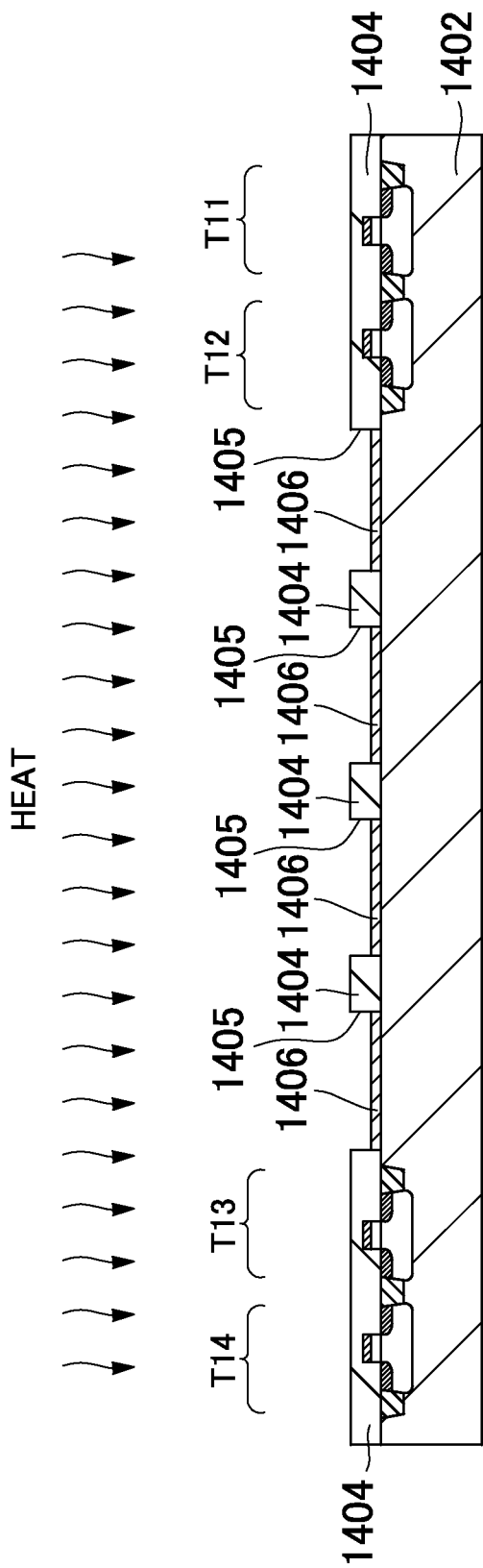
FIG. 16 illustrates an exemplary cross-section observed during the production process of the optical device 1400.
Figure 17:
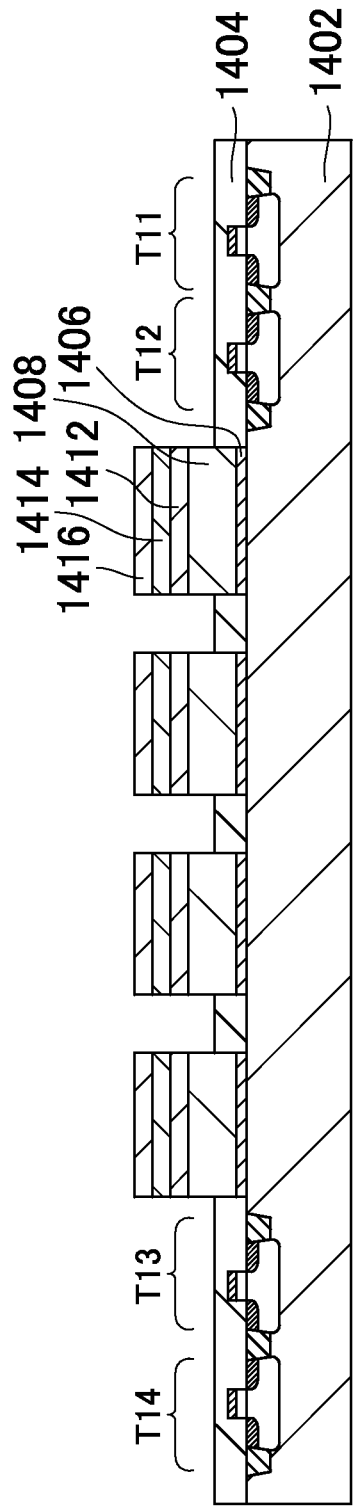
FIG. 17 illustrates an exemplary cross-section observed during the production process of the optical device 1400.

FIGS. 15 to 17 illustrate exemplary cross-sections observed during the production process of the optical device 1400. The following describes the method of producing the optical device 1400 with reference to the drawings. The method of producing the optical device 1400 includes a step of forming the silicon devices, a step of forming the protective film and the apertures, a step of forming the seed crystals 1406, a step of annealing the seed crystals 1406, a step of forming the semiconductors 1412 of the first conductivity type, a step of forming the semiconductors 1414 of the second conductivity type opposite to the first conductivity type, a step of forming the semiconductors 1416 of the first conductivity type, and a step of forming the light emitting section, the light receiving section or the heterojunction transistors. The production method may further include a step of forming the low-carrier-concentration semiconductors, between the step of forming the semiconductors 1412 of the first conductivity type and the step of forming the semiconductors 1414 of the second conductivity type, and between the step of forming the semiconductors 1414 of the second conductivity type and the step of forming the semiconductors 1412 of the first conductivity type.

In the step of forming the silicon devices, the transistors T11, T12, T13 and T14, which are silicon devices, are formed on the base wafer 1402 containing silicon, as shown in FIG. 15. The active regions of the silicon devices are formed in the silicon. After this, the N wells 1451, the P wells 1461 and the device isolation insulative layers 1472 are formed in the base wafer 1402. The base wafer 1402 may be a silicon wafer.

The N wells 1451 are formed in the following manner. A silicon oxide film is first formed on the surface of the base wafer 1402, for example, using thermal oxidization. After this, apertures are formed in the silicon oxide film using photolithography such as etching at locations at which the N wells are to be formed. Subsequently, implantation of Group 5 element ions such as phosphor (P) ions is performed using the resulting silicon oxide film as a mask. In this way, the N wells 1451 are formed. The P wells 1461 are formed in the same manner as the N wells except for that Group 3 element ions such as boron (B) ions are implanted.

The device isolation insulative layers 1472 are formed in the following manner. A silicon oxide film and a silicon nitride film are formed on the surface of the base wafer 1402. Apertures are then formed, in the oxide and nitride films, at locations where the device isolation insulative layers 1472 are to be formed, using photolithography such as etching. After this, trenches are formed using dry etching. In the trenches, silicon oxide is deposited using CVD. After this, unnecessary portions of the silicon oxide film are removed using chemical mechanical polishing (CMP). In this manner, the device isolation insulative layers 1472 are formed.

Following this, on the N wells 1451 and the P wells 1461, the gate insulators 1458 are formed, and the gate electrodes 1454 and 1464 are formed. To begin with, a silicon oxide film is formed by thermal oxidization to form the gate insulators 1458. After this, a polysilicon film doped with phosphor (P) is formed using CVD. After this, the gate electrodes 1454 and 1464 are formed using photolithography such as etching.

Following this, the sources 1452, the drains 1456, the drains 1462 and the sources 1466 are formed. The sources 1452 and drains 1456 of the P-type are formed by forming a silicon oxide film having apertures at locations where the sources 1452 and drains 1456 of the P-type are to be formed using photolithography such as etching and performing implantation of Group 3 element ions such as boron (B) ions while using the silicon oxide film as a mask. The drains 1462 and sources 1466 of the N-type are formed by forming a silicon oxide film having apertures at locations where the drains 1462 and sources 1466 of the N-type are to be formed using performing photolithography such as etching and performing implantation of Group 5 element ions such as phosphor (P) ions while using the silicon oxide film as a mask.

In the step of forming the protective film 1404 and the apertures 1405, the protective film 1404 is formed on the base wafer 1402 so as to cover the transistors T11, T12, T13 and T14, which are silicon devices, as shown in FIG. 16. The apertures 1405 are formed in the protective film 1404 so as to reach the base wafer 1402. The protective film 1404 is formed by forming a silicon oxide film using thermal oxidization and performing photolithography such as etching to form the apertures 1405 that reach the surface of the base wafer 1402 at the locations where the seed crystals 1406 are to be formed.

In the step of forming the seed crystals 1406, the seed crystals 1406 are epitaxially grown selectively within the apertures 1405. The seed crystals 1406 have a composition of $C_{x1}Si_{y1}Ge_{z1}Sn_{1-x1-y1-z1}$ ($0 \le x1 < 1$, $0 \le y1 \le 1$, $0 \le z1 \le 1$, and $0 < x1 + y1 + z1 \le 1$). The seed crystals 1406 are, for example, formed by an epitaxial growth method. The epitaxial growth method includes, for example, CVD, MOCVD, MBE, and ALD. Since the epitaxial growth of the seed crystals 1406 is inhibited on the surface of the protective film 1404, the seed crystals 1406 are epitaxially grown selectively within the apertures 1405.

In the step of annealing the seed crystals 1406, the seed crystals 1406 are heated and annealed as shown in FIG. 16. The step of forming the seed crystals 1406 and the step of annealing the seed crystals 1406 are performed without exposing the base wafer 1402 to air. The step of annealing the seed crystals 1406 may be performed in more than one stage.

In the step of forming the semiconductors 1412, the step of forming the semiconductors 1414, and the step of forming the semiconductors 1416, the buffer layers 1408 are first epitaxially grown selectively on the seed crystals 1406, and the semiconductors 1412, the semiconductors 1414, and the semiconductors 1416 are then sequentially epitaxially grown selectively on the buffer layers 1408 as shown in FIG. 17. The buffer layers 1408, the semiconductors 1412, the semiconductors 1414, and the semiconductors 1416 may lattice-match or pseudo lattice-match the annealed seed crystals 1406.

The buffer layers 1408, the semiconductors 1412, the semiconductors 1414, and the semiconductors 1416 may be Group 4 semiconductors or Group 3-5 compound semiconductors. The semiconductors 1412, the semiconductors 1414, and the semiconductors 1416 have a space charge region in the vicinity of the semiconductor junction interface. The epitaxial growth method includes, for example, CVD, MOCVD, MBE, and ALD.

In the step of forming the light emitting section, the light receiving section, or the heterojunction transistors, the heterojunction transistors T01, T02, T03 and T04 are formed as shown in FIG. 14. The transistors T01, T02, T03 and T04 may be formed using a similar process to the method of producing the optical device 1100. After the step of forming the silicon devices T11, T12, T13 and T14, the temperature of the silicon devices may be kept at 600° C. or lower. The optical device 1400 is obtained by performing the above-described steps.

Figure 18:
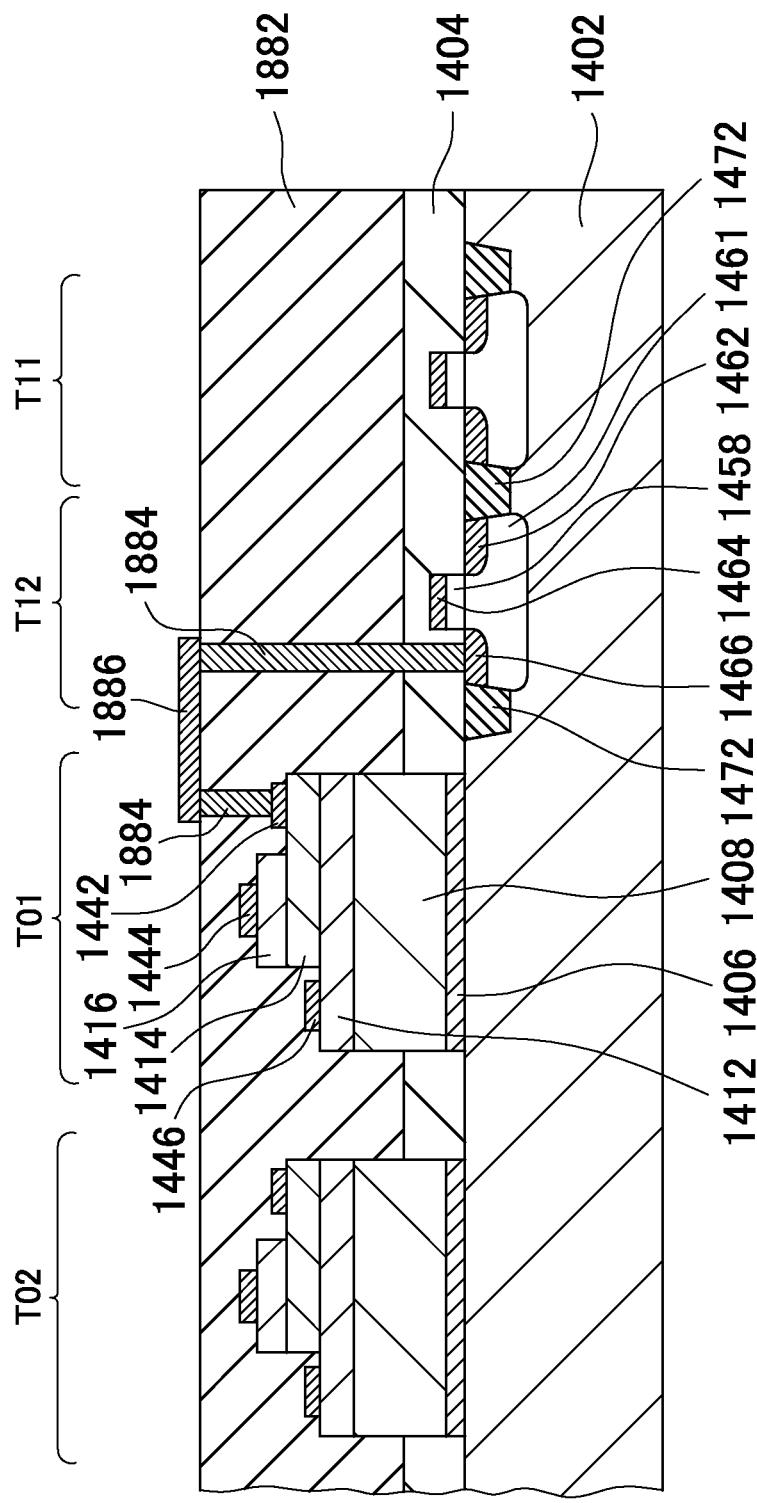
FIG. 18 illustrates an exemplary cross-section of an optical device 1800.

FIG. 18 illustrates an exemplary cross-section of an optical device 1800 relating to a different embodiment. FIG. 18 shows the enlarged right half of the optical device 1400 shown in FIG. 14, and thus shows exemplary interconnections formed in the optical device 1400. For example, the source 1466 of the transistor T12, which is a silicon device, is coupled to the base electrode 1442 of the transistor T01 through contacts 1884 and an interconnection 1886. In this example, the emitter-base junction of the transistor T01 serves as a light emitting section, and the transistor T12 serves as a switch to drive the light emitting section.

Figure 19:
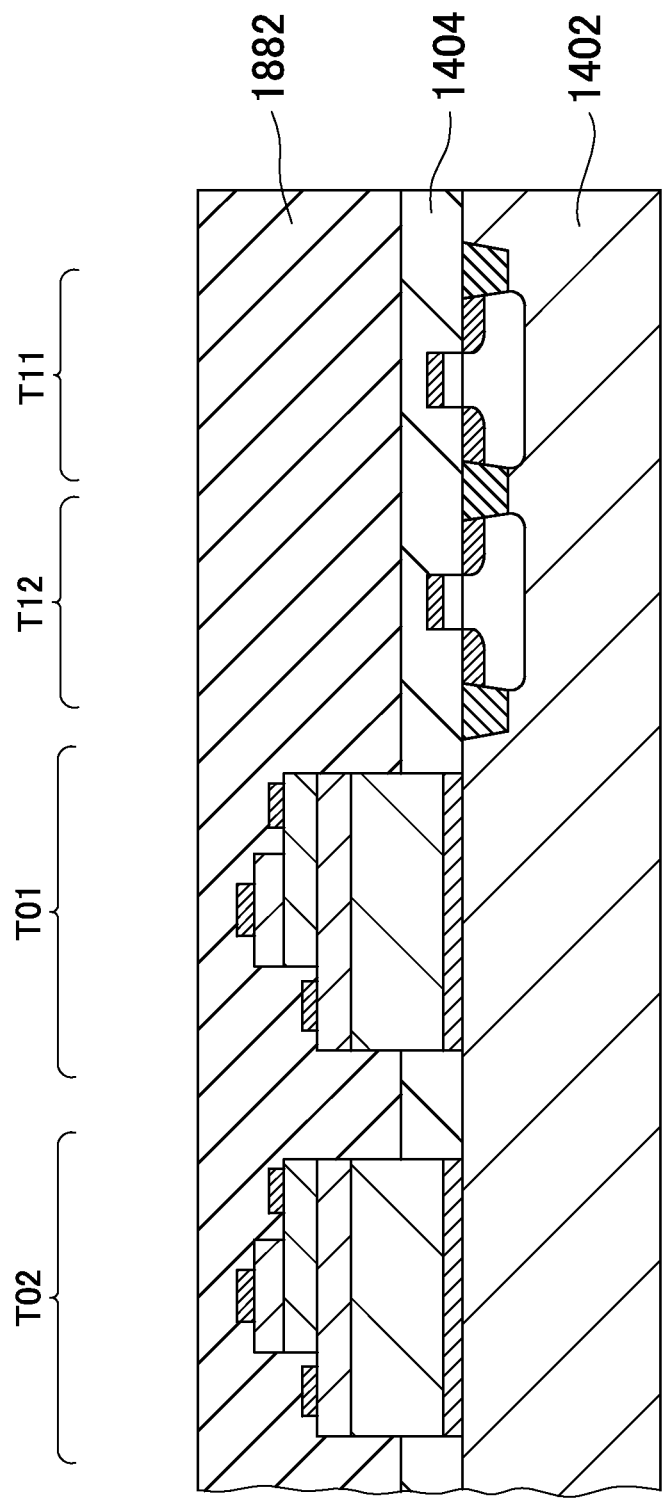
FIG. 19 illustrates an exemplary cross-section observed during the production process of the optical device 1800.
Figure 20:
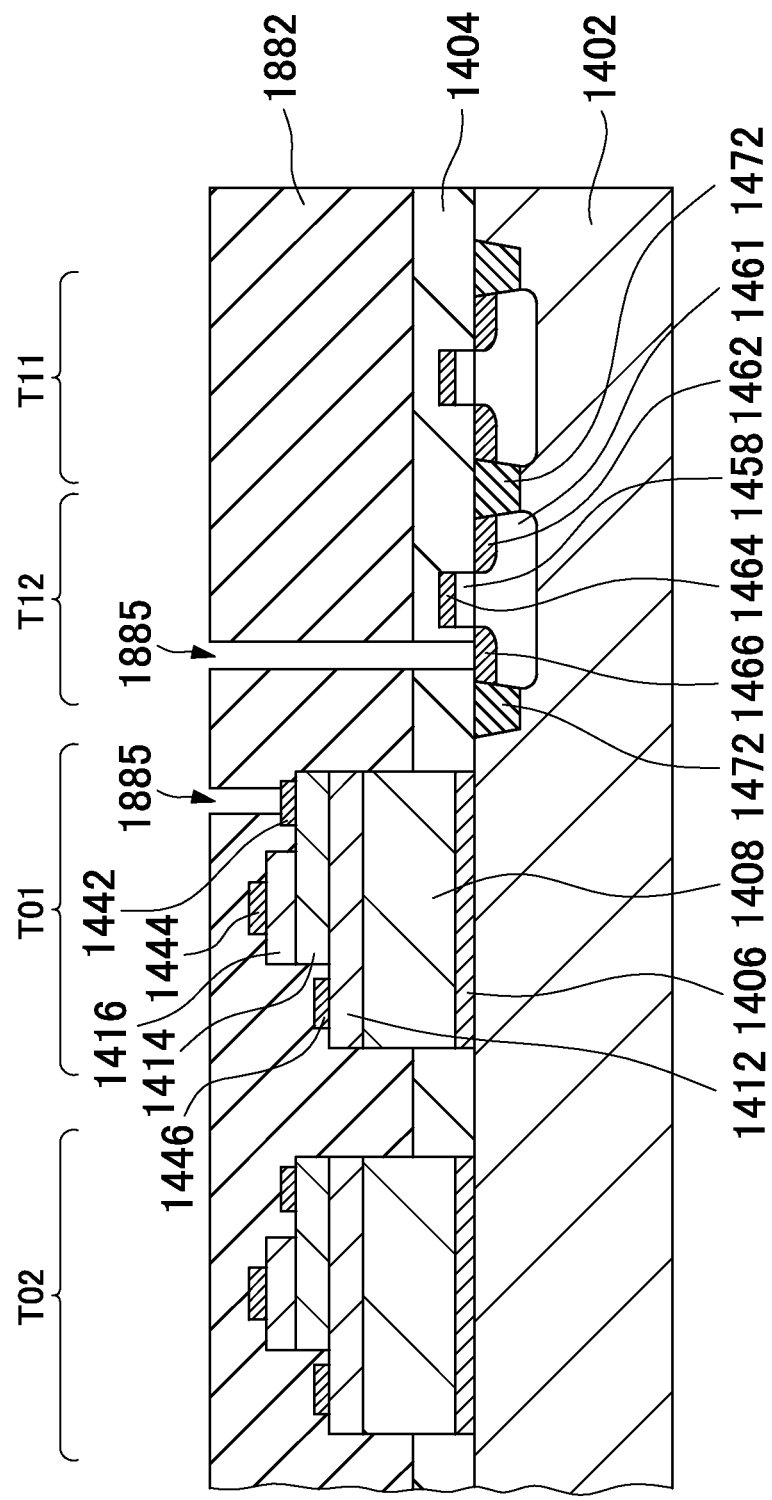
FIG. 20 illustrates an exemplary cross-section observed during the production process of the optical device 1800.

FIGS. 19 and 20 illustrate exemplary cross-sections observed during the production process of the optical device 1800. The following describes the method of producing the optical device 1800 with reference to the drawings. The method of producing the optical device 1800 includes a step of forming a passivation film 1882, a step of exposing connecting portions, and a step of establishing connection.

In the step of forming the passivation film 1882, the passivation film 1882 is formed and the surface of the passivation film 1882 is flattened using CMP, as shown in FIG. 19. The passivation film 1882 is, for example, a silicon oxide film, a silicon nitride film, a metal oxide film. The passivation film 1882 is, for example, formed using CVD or sputtering.

In the step of exposing the connecting portions, the passivation film 1882 and the protective film 1404 are at least partially removed to form apertures 1885 so that the connecting portions to establish connections between the transistor T01 and the silicon device are exposed as shown in FIG. 20. The method of removing the passivation film 1882 and the like is, for example, photolithography such as etching.

In the step of establishing connection, the contacts 1884 are formed in the apertures 1885, and the interconnection 1886 is further formed to connect the transistors T01 and T12 to each other as shown in FIG. 18. The optical device 1800 is obtained by performing the above-described steps.

During the above-described steps, the temperature of the silicon devices is kept at 600° C. or lower, preferably 450° C. or lower. In the present embodiment, a light emitting element including a light emitting section and a light receiving element including a light receiving section, a driver transistor, an amplifier transistor, and silicon devices forming peripheral circuits are all monolithically formed on the same wafer. As a result, while the optical device formed using heterojunction compound semiconductors still has advantages such as high sensitivity and high speed, the overall circuit is more highly integrated and the optical device achieves a smaller size.

<First Exemplary Embodiment>

The following describes a first exemplary embodiment, in which the semiconductor wafer 800 shown in FIG. 8 was produced. As the base wafer 802, a commercially-available silicon wafer was provided. As the inhibition layer 804, an $SiO_2$ layer was formed on the surface of the base wafer 802 using thermal oxidization. The thickness of the $SiO_2$ layer was 1 μm on average. In the $SiO_2$ layer serving as the inhibition layer 804, the apertures 805 were formed using photolithography. The apertures 805 had a size of 15 μm×15 μm.

The base wafer 802 having the inhibition layer 804 in which the apertures 805 had been formed was placed within a CVD apparatus (reaction chamber). Subsequently, Ge crystal layers were formed as the seed crystals 806 selectively within the apertures 805 in the inhibition layer 804. The Ge crystal layers were first deposited until the thickness reached approximately 20 nm under such conditions that the source gas was $GeH_4$, the pressure within the reaction chamber was 2.6 kPa, the temperature was 400° C. After this, the temperature was raised to 600° C. and the Ge crystal layers were further deposited until the thickness reached approximately 1 μm.

Following this, lamp light was applied that included infrared light of a wavelength that was more likely to be absorbed by a Ge crystal than by a Si crystal. In this way, the Ge crystals were selectively heated to be annealed. The annealing was performed at the temperature of 800° C. and for the duration of 10 minutes. Subsequently, using the annealed Ge crystals as seed layers, Group 3-5 compound semiconductor crystals were epitaxially grown selectively on the Ge crystals using MOCVD. By the selective epitaxial growth of the Group 3-5 compound semiconductor crystals, the buffer layers 808, the N-type semiconductors 812, the P-type semiconductors 814 and the N-type semiconductors 816 were formed.

The buffer layers 808 were formed in two stages. A GaAs layer of approximately 30 nm was first deposited at a growth rate of 1 μm/hr under such conditions that the pressure within the reaction chamber was set to 0.1 atm, the temperature was set to 550° C., the flow rate of trimethylgallium (TMG) was set to 5 cc/min, the flow rate of arsine ($AsH_3$) was set to 500 cc/min, and the flow rate of the highly pure hydrogen carrier gas was set to 80 l/min. After this, the supply of the trimethylgallium was suspended to stop the crystal growth of GaAs. Then, the arsine/hydrogen atmosphere was maintained, and the temperature was raised to 650° C. and stabilized. After this, the supply of trimethylgallium was resumed, and the buffer layers 808 (i.e., the non-doped GaAs layers) were deposited until the thickness reached 1 μm.

As the N-type semiconductors 812, N-type GaAs having a thickness of 1 μm was formed. By adding disilane serving as an impurity gas to the gas used to grow the buffer layers 808, Si was added as an N-type impurity element. In this way, the N-type GaAs was formed. In the middle of the formation of the N-type GaAs, the amount of disilane was changed. A first-half GaAs layer having a thickness of 0.5 μm had an electron concentration of $3×10^{18}/cm^3$, and a second-half GaAs layer having a thickness of 0.5 μm had an electron concentration of $2×10^{16}/cm^3$. Thus, a two-layered N-type GaAs layer was formed.

As the P-type semiconductors 814, P-type GaAs was formed that had a thickness of 80 nm and a hole concentration of $2×10^{19}/cm^3$. By adding trichlorobromomethane ($CCl_3Br$) serving as an impurity gas to the gas used to grow the buffer layers 808, C was added as a P-type impurity element. In this way, P-type GaAs was formed.

As the N-type semiconductors 816, a stack was formed by sequentially depositing N-type InGaP, N-type GaAs and N-type InGaAs. The supply of the trimethylgallium, trichlorobromomethane and arsine, which were supplied during the formation of the semiconductors 814, was suspended, and phosphine ($PH_3$) was introduced at the flow rate of 1 l/min to replace the atmosphere within the reaction chamber. After this, the supply of trimethylgallium, trimethylindium and disilane was started to form N-type InGaP having a thickness of 40 nm and an electron concentration of $2×10^{17}/cm^3$. Subsequently, the supply of all the source gases was suspended, and the supply of the arsine gas was resumed to replace the atmosphere within the reaction chamber. Following this, the supply of the other source gases was started to form N-type GaAs having a thickness of 200 nm and an electron concentration of $2×10^{18}/cm^3$. Furthermore, the temperature was set to 500° C. to form N-type InGaAs having a thickness of 500 nm and a concentration of $2×10^{19}/cm^3$. In this way, the semiconductor wafer 800 was produced.

<Second Exemplary Embodiment>

The following describes a second exemplary embodiment, in which the semiconductor wafer 800 produced in the first exemplary embodiment was used to produce the optical device 1100 shown in FIG. 11. As the transistors T01 and T02 included in the optical device 1100, an HBT was formed by using the semiconductors 812, 814 and 816 of the semiconductor wafer 800 respectively as the collector layer, the base layer and the emitter layer. The method of forming the HBT was not described here. Testing the operations of the transistors T01 and T02 revealed that the transistors T01 and T02 respectively exhibited current amplification factors of 165 and 175 for the collector current density of 1 kA/cm2. In other words, it was confirmed that the transistors T01 and T02 could normally operate as current amplification elements.

<Third Exemplary Embodiment>

The semiconductor wafer 800 produced in the first exemplary embodiment was used to produce the optical device 600 shown in FIG. 6. Here, the optical device 600 was a light emitting device. From the stack serving as the N-type semiconductor 816, which is constituted by N-type InGaP, N-type GaAs and N-type InGaAs, the N-type InGaAs and the N-type GaAs were removed by etching. The N-type InGaP left after the etching is equivalent to the semiconductor 114 shown in FIG. 6. The P-type semiconductor 814 is equivalent to the semiconductor 112 shown in FIG. 6. The semiconductor 114 (the N-type semiconductor) was partially removed to expose the surface of the semiconductor 112 (the P-type semiconductor). After this, AuGe/Ni/Au was deposited on the semiconductor 114 and then heated. In this way, the electrode 634 (the N-type ohmic electrode) was formed. Furthermore, AuZn was deposited on the partially-exposed semiconductor 112 (the P-type semiconductor) and heated. In this way, the electrode 632 (the P-type ohmic electrode) was formed.

When applied with a forward bias voltage, the element P01 having the PN junction formed in the above-described manner was observed to emit light having a wavelength of approximately 860 nm. Thus, it was confirmed that the element P01 could normally operate as a light emitting device. FIG. 21 illustrates the results of observing the light emitted when a driving current is applied to the element P01. In FIG. 21, the horizontal axis represents the applied driving current, and the vertical axis represents the emitted light. As seen from FIG. 21, when applied with a driving current in a range from 20 mA to 70 mA, the element P01 was observed to emit light whose intensity is in proportion to the applied current.

<Fourth Exemplary Embodiment>

The semiconductor wafer 800 produced in the first exemplary embodiment was used to produce the optical device 600 shown in FIG. 6. Here, the optical device 600 was a light receiving device. Etching was performed to remove the stack serving as the N-type semiconductor 816, which is constituted by N-type InGaAs, N-type GaAs and N-type InGaP. In this way, the P-type GaAs layer was exposed. The P-type GaAs layer is equivalent to the semiconductor 114 shown in FIG. 6. The two-layered semiconductor 812, which is constituted by the N-type GaAs layer having a thickness of 0.5 μm and an electron concentration of $3\times10^{18}/cm^3$ and the N-type GaAs layer having a thickness of 0.5 μm and an electron concentration of $2\times10^{16}/cm^3$, is equivalent to the semiconductor layer 112 shown in FIG. 6.

The semiconductor 114 (the P-type semiconductor) was partially removed, and the N-type GaAs layer having an electron concentration of $2\times10^{16}/cm^3$ of the semiconductor 112 (the N-type semiconductor) was also partially removed. In this way, the N-type GaAs layer having an electron concentration of $3\times10^{18}/cm^3$ was partially exposed. After this, AuZn was deposited on the semiconductor 114 and heated. In this way, the electrode 634 (the P-type ohmic electrode) was formed. Furthermore, AuGe/Ni/Au was deposited on the partially exposed surface of the N-type GaAs layer having an electron concentration of $3\times10^{18}/cm^3$ and heated. In this way, the electrode 632 (the N-type ohmic electrode) was formed.

Then, HeNe laser light having a wavelength of 633 nm was applied to the element P01 having the PN junction formed in the above-described manner. As a result, a photocurrent was observed that has an intensity according to the intensity of the applied laser light, between the electrode 632 and the electrode 634. Thus, it was confirmed that the element P01 could normally operate as a light receiving device. FIG. 22 illustrates the results of observing the photocurrent generated when laser light enters the element P01. In FIG. 22, the horizontal axis represents the intensity of the laser light, and the vertical axis represents the photocurrent. As shown in FIG. 22, as the intensity of the applied laser light increased, the photocurrent increased in proportion to the intensity of the laser light.

From the above-discussed exemplary embodiments, it was confirmed that the semiconductor crystals selectively formed on a single silicon wafer could be used to monolithically form a light emitting device, a light receiving device and a heterojunction transistor that can be configured to amplify signals.

<Fifth Exemplary Embodiment>

As the base wafer 102, a silicon wafer was provided. As the inhibition layer 104, an $SiO_2$ layer was formed on the surface of the base wafer 102 using thermal oxidization. The thickness of the $SiO_2$ layer was 0.1 μm on average. The aperture 105 was formed in the $SiO_2$ layer serving as the inhibition layer 104 using photolithography. The aperture 105 had a size of 20 μm×20 μm.

The base wafer 102 having the inhibition layer 104 in which the aperture 105 had been formed was placed within a CVD apparatus (reaction chamber). Subsequently, a Ge crystal was formed as the seed crystal 106 selectively within the aperture 105 in the inhibition layer 104. The Ge crystal was formed under similar conditions to the Ge crystals of the first exemplary embodiment.

Following this, lamp light that included infrared light of a wavelength that was more likely to be absorbed by a Ge crystal than by an Si crystal was applied to the entire base wafer 102. In this way, the Ge crystal was selectively heated. This heating annealed the Ge crystal. After a first annealing operation was performed to heat the Ge crystal to 800° C. for 10 minutes, a second annealing operation was performed to heat the Ge crystal to 680° C. for 10 minutes. The set of the first and second annealing operations was performed 10 times. Here, the annealing was performed without removing the base wafer 102 from the reaction chamber after the Ge crystal was formed.

Figure 23:
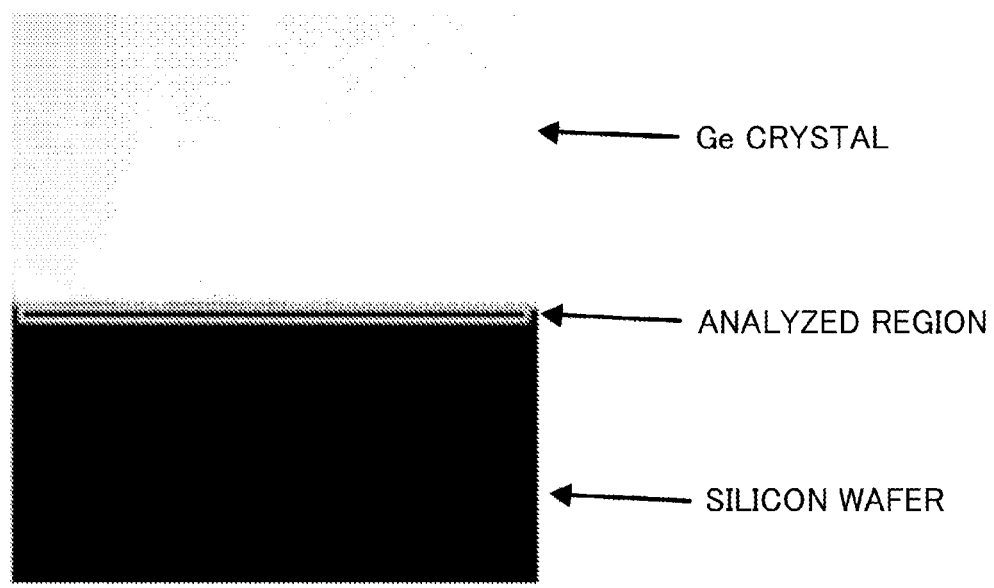
FIG. 23 is an SEM photograph showing a cross-section in the vicinity of the silicon wafer/Ge crystal interface in a semiconductor wafer of a fifth exemplary embodiment.
Figure 24:
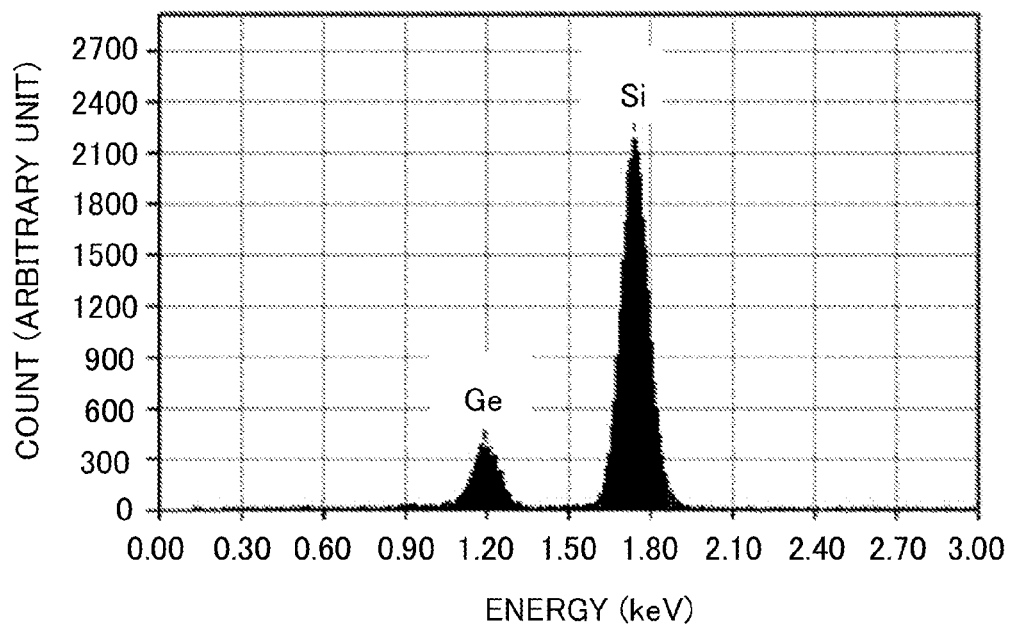
FIG. 24 illustrates the results of performing energy dispersive X-ray fluorescence analysis on the analyzed region of FIG. 23.

FIG. 23 is an SEM photograph showing the cross-section in the vicinity of the interface between the base wafer 102, which is a silicon wafer, and the Ge crystal formed thereon. FIG. 24 illustrates the results of performing energy dispersive X-ray fluorescence analysis on an analyzed region of FIG. 23. As seen from FIG. 24, even though the analyzed region is positioned on the silicon-wafer side with respect to the interface between the silicon wafer and the Ge crystal, a strong signal of Ge was detected. Although not shown, similar observation performed prior to the annealing detected a very weak Ge signal and a very strong Si signal.

The above-described analysis could prove that the annealing caused the Ge atoms to be diffused into the silicon wafer. The above-described analysis indicates that the base wafer 102 has therein an interface region made of SiGe, which is in contact with the interface between the base wafer 102 and the seed crystal 106. Considering the fact that the Ge atoms are diffused within the silicon wafer, y3>y1 holds true, where y1 denotes the silicon proportion within the seed crystal 106 and y3 denotes the silicon proportion of the interface region.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. An optical device comprising:
    a base wafer containing silicon;
    a plurality of seed crystals disposed on the base wafer; and
    a plurality of Group 3-5 compound semiconductors lattice-matching or pseudo lattice-matching the plurality of seed crystals, wherein
    at least one of the Group 3-5 compound semiconductors has a photoelectric semiconductor formed therein, the photoelectric semiconductor including a light emitting semiconductor that emits light in response to a driving current supplied thereto or a light receiving semiconductor that generates a photocurrent in response to light applied thereto,
    at least one of the plurality of Group 3-5 compound semiconductors other than the Group 3-5 compound semiconductor having the photoelectric semiconductor has a heterojunction transistor formed therein,
    the plurality of seed crystals are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$), and
    the light emitting semiconductor and the light receiving semiconductor are Group 3-5 compound semiconductors.

2. A semiconductor wafer comprising:
    a base wafer containing silicon;
    a plurality of seed crystals disposed directly or indirectly on the base wafer; and a plurality of Group 3-5 compound semiconductors lattice-matching or pseudo lattice-matching the plurality of seed crystals, wherein at least one of the Group 3-5 compound semiconductors is a semiconductor that has a photoelectric semiconductor that includes therein a semiconductor that can serve as a light emitting semiconductor that outputs light in response to a driving current to be supplied thereto or a semiconductor that can serve as a light receiving semiconductor that generates a photocurrent in response to light to be applied thereto, at least one of the plurality of Group 3-5 compound semiconductors other than the Group 3-5 compound semiconductor having the photoelectric semiconductor is a semiconductor in which a heterojunction transistor can be formed, and the plurality of seed crystals are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$).

3. A semiconductor wafer comprising:
a base wafer containing silicon;
a plurality of seed crystals disposed directly or indirectly on the base wafer; and
a plurality of Group 3-5 compound semiconductors lattice-matching or pseudo lattice-matching the plurality of seed crystals, wherein at least one of the Group 3-5 compound semiconductors is a semiconductor that has a photoelectric semiconductor that includes therein a semiconductor that can serve as a light emitting semiconductor that outputs light in response to a driving current to be supplied thereto or a semiconductor that can serve as a light receiving semiconductor that generates a photocurrent in response to light to be applied thereto, at least one of the plurality of Group 3-5 compound semiconductors other than the Group 3-5 compound semiconductor having the photoelectric semiconductor is a semiconductor in which a heterojunction transistor can be formed, the base wafer is in contact with the seed crystals, an interface region is included in the base wafer, in contact with the plurality of interfaces between the base wafer and the plurality of seed crystals and is made of $C_{x3}Si_{y3}Ge_{z3}Sn_{1-x3-y3-z3}$ ($0 \leq x3 < 1$, $0 < y3 \leq 1$, $0 \leq z3 \leq 1$ and $0 < x3+y3+z3 \leq 1$), and the silicon proportion y1 of the plurality of seed crystals is smaller than the silicon proportion y3 of the interface region.

4. An optical device comprising:
a base wafer containing silicon;
a plurality of seed crystals disposed on the base wafer;
a plurality of Group 3-5 compound semiconductors lattice-matching or pseudo lattice-matching the plurality of seed crystals; and
an inhibition layer that is formed directly or indirectly on the base wafer, has a plurality of apertures in which at least a partial region of the base wafer is exposed, and inhibits crystal growth, wherein at least one of the Group 3-5 compound semiconductors has a photoelectric semiconductor formed therein, the photoelectric semiconductor including a light emitting semiconductor that emits light in response to a driving current supplied thereto or a light receiving semiconductor that generates a photocurrent in response to light applied thereto, at least one of the plurality of Group 3-5 compound semiconductors other than the Group 3-5 compound semiconductor having the photoelectric semiconductor has a heterojunction transistor formed therein, and the seed crystals are formed within the apertures.

5. The optical device as set forth in claim 4, wherein
the heterojunction transistor supplies the driving current to the light emitting semiconductor or amplifies the photocurrent.

6. The optical device as set forth in claim 4, wherein
the photoelectric semiconductor includes:
a first-conductivity-type semiconductor containing an impurity that exhibits a first conductivity type that is one of P type and N type;
a second-conductivity-type semiconductor containing an impurity that exhibits a conductivity type opposite to that of the first-conductivity-type semiconductor; and
a low-carrier-concentration semiconductor that is formed between the first-conductivity-type semiconductor and the second-conductivity-type semiconductor and has a lower carrier concentration than the first-conductivity-type semiconductor and the second-conductivity-type semiconductor.

7. The optical device as set forth in claim 4, wherein
the plurality of seed crystals are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$), and
the light emitting semiconductor and the light receiving semiconductor are Group 3-5 compound semiconductors.

8. The optical device as set forth in claim 4, further comprising
a silicon device formed in a region of the base wafer, the region being made of silicon, wherein
the photoelectric semiconductor is electrically coupled to the silicon device.

9. The optical device as set forth in claim 8, wherein
when the photoelectric semiconductor includes the light emitting semiconductor, the silicon device supplies the driving current to the light emitting semiconductor, and
when the photoelectric semiconductor includes the light receiving semiconductor, the silicon device amplifies the photocurrent.

10. The optical device as set forth in claim 8, wherein
the photoelectric semiconductor is electrically coupled to the silicon device via the heterojunction transistor.

11. The optical device as set forth in claim 10, wherein
when the photoelectric semiconductor includes the light emitting semiconductor, the silicon device outputs a control signal to control the heterojunction transistor, and
when the photoelectric semiconductor includes the light receiving semiconductor, the silicon device amplifies an electric signal output from the heterojunction transistor.

12. A semiconductor wafer comprising:
a base wafer containing silicon;
a plurality of seed crystals disposed directly or indirectly on the base wafer;
a plurality of Group 3-5 compound semiconductors lattice-matching or pseudo lattice-matching the plurality of seed crystals; and
an inhibition layer that is formed directly or indirectly on the base wafer, has a plurality of apertures in which at least a partial region of the base wafer is exposed, and inhibits crystal growth, wherein at least one of the Group 3-5 compound semiconductors is a semiconductor that has a photoelectric semiconductor that includes therein a semiconductor that can serve as a light emitting semiconductor that outputs light in response to a driving current to be supplied thereto or a semiconductor that can serve as a light receiving semiconductor that generates a photocurrent in response to light to be applied thereto, at least one of the plurality of Group 3-5 compound semiconductors other than the Group 3-5 compound semiconductor having the photoelectric semiconductor is a semiconductor in which a heterojunction transistor can be formed, and the plurality of seed crystals are formed within the plurality of apertures.

13. The semiconductor wafer as set forth in claim 12, wherein the heterojunction transistor supplies the driving current to the light emitting semiconductor or amplifies the photocurrent.

14. The semiconductor wafer as set forth in claim 12, wherein the photoelectric semiconductor includes:

a first-conductivity-type semiconductor containing an impurity that exhibits a first conductivity type that is one of P type and N type;

a second-conductivity-type semiconductor containing an impurity that exhibits a conductivity type opposite to that of the first-conductivity-type semiconductor; and a low-carrier-concentration semiconductor that is formed between the first-conductivity-type semiconductor and the second-conductivity-type semiconductor and has a lower carrier concentration than the first-conductivity-type semiconductor and the second-conductivity-type semiconductor.

15. The semiconductor wafer as set forth in claim 12, wherein each of the plurality of Group 3-5 compound semiconductors is a semiconductor in which a photoelectric semiconductor and a heterojunction transistor can be formed, the photoelectric semiconductor including a light emitting semiconductor that can output light in response to a driving current supplied thereto or a light receiving semiconductor that can generate a photocurrent in response to light applied thereto.

16. The semiconductor wafer as set forth in claim 12, wherein the plurality of seed crystals are $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$).

17. The semiconductor wafer as set forth in claim 12, wherein the base wafer is in contact with the seed crystals, an interface region is included in the base wafer, in contact with the plurality of interfaces between the base wafer and the plurality of seed crystals and is made of $C_{x3}Si_{y3}Ge_{z3}Sn_{1-x3-y3-z3}$ ($0 \leq x3 < 1$, $0 < y3 \leq 1$, $0 \leq z3 \leq 1$ and $0 < x3+y3+z3 \leq 1$), and the silicon proportion y1 of the plurality of seed crystals is smaller than the silicon proportion y3 of the interface region.

\* \* \* \* \*